(12) United States Patent
Mosterman et al.

(10) Patent No.: US 7,167,817 B2
(45) Date of Patent: Jan. 23, 2007

(54) AUTOMATED APPROACH TO RESOLVING ARTIFICIAL ALGEBRAIC LOOPS

(75) Inventors: Pieter J. Mosterman, Framingham, MA (US); John Edward Ciolfi, Wellesley, MA (US)

(73) Assignee: The Mathworks, Inc., Natick, MA (US)

( * ) Notice: Subject to any disclaimer, the term of this patent is extended or adjusted under 35 U.S.C. 154(b) by 507 days.

(21) Appl. No.: 10/666,809

(22) Filed: Sep. 17, 2003

(65) Prior Publication Data
US 2005/0060129 A1    Mar. 17, 2005

(51) Int. Cl.
G06F 17/10 (2006.01)
(52) U.S. Cl. .......................................... 703/2
(58) Field of Classification Search .............. 703/2, 703/22
See application file for complete search history.

(56) References Cited

U.S. PATENT DOCUMENTS

| | | | | |
|---|---|---|---|---|
| 4,796,179 | A * | 1/1989 | Lehman et al. | 700/86 |
| 6,571,135 | B1 * | 5/2003 | Bergold et al. | 700/42 |
| 6,801,881 | B1 * | 10/2004 | Shah | 703/2 |
| 2004/0039555 | A1 * | 2/2004 | Ulyanov et al. | 703/2 |

OTHER PUBLICATIONS

Guasch, A. et al, "Precompiled Submodels: A General Sorting Procedure," *Proceedings of the 2nd European Simulation Congress*, Sep. 9-12, 1986, pp. 172-178.
Thomas, Drea, "Q&A," *The MathWorks MATLAB Digest*, vol. 3(1):1-8 (1995).
Mosterman, Pieter J. et al, "Using Interleaved Execution to Resolve Cyclic Dependencies in Time-Based Block Diagrams," *43rd IEEE Conference on Decision and Control*, Dec. 14-17, 2004, pp. 4057-4062.
Pearce, J.G., "The Submodel Concept in Continuous System Simulation Languages," *Simulation of Dynamical Systems, IEEE Colloquium on Simulation of Dynamical Systems*, pp. 2/1-2/3 (2002).
"Using Simulink Version 5," The MathWorks, Inc., (2002).
"Using Simulink Version 6," The MathWorks, Inc. (2004).
International Search Report for Application No. PCT/US2004/030098, dated Jun. 13, 2006.

* cited by examiner

*Primary Examiner*—Albert W. Paladini
(74) *Attorney, Agent, or Firm*—Lahive & Cockfield LLP

(57) ABSTRACT

A method and apparatus for resolving artificial algebraic loops in model executions include providing an executable process having a plurality of functions. An analysis step identifies whether the process includes at least one potential artificial algebraic loop. If at least one potential artificial algebraic loop exists in the process, an artificial algebraic loop solution manipulates the order or manner by which the functions are executed to eliminate or otherwise resolve the artificial algebraic loop.

48 Claims, 25 Drawing Sheets

Sorted List:  ← 128

0:0  Sine Wave 1
0:1  Sine Wave 2
0:2  Function-Call Generator
0:3  Function-Call Subsystem
0:4  Integrator
0:5  Gain (algebraic id 0#1)
0:6  Sum (algebraic variable for id 0#1)
0:7  Out1

AUTOMATED APPROACH TO RESOLVING ARTIFICIAL ALGEBRAIC LOOPS

FIELD OF THE INVENTION

The present invention relates to a method and apparatus suitable for resolving algebraic loops in execution of a model, and more particularly to a method and software application for identifying and resolving artificial algebraic loops in model executions.

BACKGROUND OF THE INVENTION

Dynamic systems are typically modeled in simulation environments as sets of differential, difference, and/or algebraic equations. At any given instant of time, these equations may be viewed as relationships between the system's output response ("outputs"), the system's input stimuli ("inputs") at that time, the current state of the system, the system parameters, and time. The state of the system may be thought of as a numerical representation of the dynamically changing configuration of the system. For instance, in a physical system modeling a simple pendulum, the state may be viewed as the current position and velocity of the pendulum. Similarly, a signal-processing system that filters a signal would maintain a set of previous inputs as the state. The system parameters are the numerical representation of the static (unchanging) configuration of the system and may be viewed as constant coefficients in the system's equations. For the pendulum example, a parameter is the length of pendulum and for the filter example; a parameter is the values of the filter taps.

There are four common types of mathematical models used in the study of dynamic systems. The first type of mathematical model describes systems using ordinary differential equations (ODEs) and is depicted in FIG. 1A. The dynamic system 2 specifies a set of two equations: Output 4 and Derivative 6. The Output equation 4 facilitates the computation of the system's output response at a given time instant as a function of its inputs, states, parameters, and time. The Derivative equation 6 is an ordinary differential equation that allows the computation of the derivative of the states at the current time as a function of the inputs, the states, parameters, and time. This class of models is suitable for systems in which it is important to track the system response as a continuous function of time. Such continuous-time systems are commonly representative of physical systems (mechanical, thermal, electrical). For simple systems, it may be possible to use the Output 4 and Derivative equations 6 to obtain a closed-form solution for the output response y(t). But in most complex real world systems, the response of the system is obtained by integrating the states through numerical means.

The definition of an ODE used herein encompasses both implicit and explicit differential equations. The class of ordinary differential equations may require additional equations to define the system being modeled. For example, equations called projections may be required to impose constraints on the differential variables (e.g., states $X_1$ and $X_2$ must fall on the manifold defined by $x_1^2 + x_2^2 = 25$). These constraints can be either applied as a secondary condition or a coupled condition to the differential equation. Although systems including the projections may conventionally no longer qualify as an ODE; they are included here to simplify the categories of systems. Another example is the use of a Jacobian equation that defines partial derivatives with respect to the independent and/or differential variables. The Jacobian equation is typically used when obtaining a linear approximation of a non-linear model or an overall linear model of a set of equations. Jacobian equations are required for some forms of numerical integration, for producing the linear model once the model has reached its steady state operating point, etc. The Output 4 and Derivatives equations 6 may be extended to define other relationships for the block. For example, the Output equation 4 may help manage its states by defining a relationship where it resets the state back to a known quantity at a specific point in time or when a specific condition is seen.

Another type of mathematical model describes systems using difference equations as depicted in FIG. 1B. The dynamic system 8 specifies a set of two equations: Output 10 and Update 12. The Output equation 10 facilitates the computation of the system's output response at a given time instant as a function of the inputs, states at some previous time, parameters, and time. The Update equation 12 is a difference equation that allows the computation of the states at the current time as a function of the inputs, states at some previous time, parameters, and time. This class of models is suitable for systems in which it is important to track the system response at discrete points in time. Such discrete-time systems are commonly representative of discrete-time control and digital signal processing systems. For simple systems, it may be possible to use the Output 10 and Update equations 12 to obtain a closed-form solution for the output response y(t). But in most complex real world systems, the response of the system is solved through recursion. The Output 10 and Update equations 12 are applied repeatedly to solve for the system response over a period of time.

An additional type of mathematical model describes systems using algebraic equations as depicted in FIG. 1C. The dynamic system 14 uses an algebraic equation 16 that needs to be solved at each time to obtain the outputs. While simple systems may allow one to obtain a closed-form solution for the system inputs and outputs, practical algebraic equations may best be solved iteratively using a numerical method involving both perturbations and iterations. Algebraic equation solving techniques used in the context of dynamic system modeling are discussed in greater detail below.

A fourth type of mathematical model is a composite system that has components that fall into the three types of models discussed above. Most complex real-world system models fall into this category. This class of systems has Output, Derivative, Update, and potentially other equations. Solving for the output response of such systems requires a combination of the solution approaches discussed for all of the classes above. One example of a composite system is one described by differential-algebraic equations (DAEs) which contain both differential equations and algebraic equations. Grouped within the composite class of systems are many extensions involving relationships (equations) defined in terms of both outputs and state. For example, one can define a limited integration relationship for a differential variable. This relationship requires a set of equations that includes the Output equation, an Update equation, a Derivative equation, and a Zero-crossing equation. The Zero-crossing equation defines the points in time where the upper and lower limits of the limited integration occur. Another example of an extension is the notion of Enable and Disable equations that define relationships among states or signals when parts of a system are activated and deactivated during execution.

Inherent in the four classes of systems (ODE, difference equations, algebraic equations and composite) is the notion of system sample time. The sample time is the time interval at which the inputs, state, or outputs (collectively referred to as the results) of the system are traced as time progresses. Based on sample times, a system can be described as a discrete-time system, continuous-time system and hybrid system. A discrete-time system is a system in which the evolution of the system results are tracked at finite intervals of time. In the limit as the interval approaches zero, the discrete-time system becomes a continuous-time system. The intervals of time may be periodic or non-periodic. Sometimes, non-periodic rate systems are referred to as non-uniform rate systems meaning that there is no periodic rate at which the response can be tracked. Non-uniform-rate systems can fall into the class of composite systems where an additional equation (GetTimeOfNextVarHit) defines when in the future the other equations associated with the system should be evaluated. A continuous-time system is a system in which the evolutions of the system results are continuously changing. Continuous-time signals change during numerical integration (minor time steps). An example of a continuous-time system is one described by an ODE. There can also be algebraic or composite continuous-time systems. A hybrid system is a system with both discrete-time and continuous-time elements.

If a system has only one sample time, it is said to be single-rate. If a system has multiple sample times, it is said to be multi-rate. Multi-rate systems can be evaluated (executed) using either a single-tasking form of execution or a multi-tasking form of execution. When multi-tasking execution is used, it conforms to rate monotonic scheduling principals as defined by LIU, C. L., and LAYLAND, J. W. *Scheduling Algorithms for Multiprogramming in a Hard-Real-Time Environment*. ACM 20, 1 (January 1973), 46–61. Systems may also be categorized by the type of numerical integration solver being used. A fixed-step system is one that uses a fixed-step solver. Fixed-step solvers typically use explicit methods to compute the next continuous state at fixed periodic intervals of time. A variable-step system is one that is using a variable-step solver. A variable-step solver can use either implicit or explicit methods to compute the next continuous state at non-periodic intervals of time. Generally, variable-step solvers use a form of error control to adjust the interval size such that the desired error tolerances are achieved.

In practice, except for the most basic systems, mathematical models for dynamic systems involve a complex set of mathematical transformations applied in some prescribed manner with the outputs of some transformations forming the inputs of others. Each elemental transformation may be viewed in isolation as a simple dynamic system falling into one of the categories listed above. Therefore, a complex dynamic system may be modeled as an interconnection of various simple dynamic systems. A schematic representation of such an interconnection that has evolved over the years is the block diagram. Such block diagram models have now become a standard means in textbooks, design papers, journal articles, and specifications to communicate the details of a dynamic system's behavior.

A block diagram model of a dynamic system is represented schematically as a collection of blocks interconnected by lines that represent signals. A signal represents the input and output of a dynamic system. Each block represents an elemental dynamic system. A line emanating at one block and terminating at another signifies that the output of the first block is an input to the second block. Each distinct input or output on a block is referred to as a port. Signals correspond to the time-varying quantities represented by each line connection and are assumed to have values at each time instant. The source block of a signal writes to the signal at a given time instant when its system equations are solved. The destination blocks of this signal read from the signal when their system equations are being solved. The basic components of a block diagram are illustrated in FIG. 2. The block diagram includes a plurality of blocks 20, lines 22 and ports 24 that are interconnected. Those skilled in the art will recognize that the term "blocks" does not refer exclusively to elemental dynamic systems but may also include other modeling elements that aid in readability and modularity of block diagrams.

The theory of Digital Signal Processing (DSP) focuses on modeling signals as sequences of samples. This view naturally fits into the time-based block diagram paradigm by mapping the samples u[n] to discrete-time points $u(t_k)$. This adds the benefit of being able to model the interaction between DSP systems and other classes of time-based systems, e.g. continuous and/or discrete-time control systems.

Put another way, block diagram models are time-based relationships between signals and state variables representative of a dynamic system. The solution (computation of system response) of the model is obtained by evaluating these relationships over time, where time starts at a user-specified "start time" and ends at a user-specified "stop time". Each evaluation of these relationships is referred to as a time step. Signals represent quantities that change over time, and these quantities are defined for all points in time between the block diagram's start and stop time. The relationships between signals and state variables are defined by sets of equations represented by blocks. These equations define a relationship between the input signals, output signals, state, and time. Inherent in the definition is the notion of parameters, which are the coefficients of the equations.

It is important to note that block diagrams are not exclusively used for representing time-based dynamic systems but also for other models of computation. For instance, flowcharts are block diagrams used to capture process flow and are not generally suitable for describing dynamic system behavior. Data flow block diagrams are block diagrams that describe a graphical programming paradigm where the availability of data (often thought of as tokens) is used to initiate the execution of blocks, where a block represents an operation and a line represents execution dependency describing the direction of data flowing between blocks. As used herein, the term block diagrams means time-based block diagrams used in the context of dynamic systems except as otherwise noted.

Block diagram modeling has spawned a variety of software products such as Simulink® from the MathWorks, Inc. of Natick, Mass., that cater to various aspects of dynamic system analysis and design. Such products allow users to perform various types of tasks including constructing system models through a user-interface that allows drafting block diagram models, allowing augmentation of a pre-defined set of blocks with custom user-specified blocks, the use of the block diagram model to compute and trace the temporal evolution of the dynamic system's outputs ("executing" the block diagram), and automatically producing either deployable software systems or descriptions of hardware systems that mimic the behavior of either the entire model or portions of it (referred to herein as "code generation"). Each of the tasks listed above has many intricate details and subtle variations that are explored further below.

Block modeling software includes a number of generic components. Although the discussion contained herein focuses on Simulink® version 5.0 (Release 13) from the MathWorks, Inc. of, Natick Mass., those skilled in the art will recognize that it is applicable to other block modeling software applications. The generic components include a block diagram editor, blocks and a block diagram execution engine. The block diagram editor allows users to perform such actions as draw, edit, annotate, save, and print out block diagram representations of dynamic systems. As noted earlier, blocks are the fundamental mathematical elements of a classic block diagram model. Simulink® extends the classic block diagram models by introducing the notion of two classes of blocks, nonvirtual blocks and virtual blocks. Nonvirtual blocks are elementary dynamic systems. A virtual block is provided for graphical organizational convenience and plays no role in the definition of the system of equations described by the block diagram model. Examples of virtual blocks are the Bus Creator virtual block and Bus Selector virtual block which are used to reduce block diagram clutter by managing groups of signals as a "bundle". Virtual blocks may be used to improve the readability of models. Simulink® further extends the meaning of a nonvirtual block to include other semantics, such as a "merge" block semantic. The merge block semantic is such that on a given time step its output is equal to the last block to write to an input of the merge block. An additional extension provided by Simulink® is the concept of conditional execution. Simulink® contains the concept of conditional and iterative sub-systems that control when in time block methods execute for a sub-section of the overall block diagram.

A block diagram execution engine contributes to the modeling software task of enabling the computation and tracing of a dynamic system's outputs from its block diagram model. An execution engine carries out the task of compiling and linking the block diagram to produce an "in-memory executable" version of the model that is used for generating code and/or simulating or linearizing a block diagram model. Note that execution of the block-diagram is also referred to as simulation. The compile stage involves checking the integrity and validity of the block interconnections in the block diagram. In this stage, the engine also sorts the blocks in the block diagram into hierarchical lists that are used when creating the block method execution lists. In the link stage, the execution engine uses the result of the compiled stage to allocate memory needed for the execution of the various components of the block diagram. The linking stage also produces block method execution lists that are used by the simulation or linearization of the block diagram. Included within the link stage is the initialization of the model which includes the evaluating of "setup" methods (e.g. block start, initialize, enable, and constant output methods). The block method execution lists are generated because the simulation and/or linearization of a model must execute block methods by type (not by block) when they have a sample hit.

After linking has been performed, the execution engine may generate code. In this stage, the execution engine may choose to translate the block diagram model (or portions of it) into either software modules or hardware descriptions (broadly termed code). If this stage is performed, then the stages that follow use the generated code during the execution of the block diagram. If this stage is skipped completely, then the execution engine uses an interpretive mode of execution for the block diagram. In some cases, the user may not proceed further with the execution of the block diagram because they would like to deploy the code outside the confines of the block diagram software. Upon reaching the simulation stage, the execution engine uses a simulation loop to execute block methods in a pre-defined ordering upon a sample hit to produce the system responses as they change with time.

For linearization, Simulink® uses the block method execution lists in a prescribed fashion to produce a linear state space representation of the dynamic system described by the block diagram.

The block diagram editor is the graphical user interface (GUI) component that allows drafting of block diagram models by a user. In Simulink®, there is also a textual interface with a set of commands that allow interaction with the graphical editor. Using this textual interface, users may write special scripts that perform automatic editing operations on the block diagram. A user generally interacts with a set of windows that act as canvases for the model. There is generally more than one window for a model because models may be partitioned into multiple hierarchical levels through the use of sub-systems (discussed further below).

A suite of GUI tools in Simulink® allows users to draft a block diagram model on the corresponding windows. The GUI tools include a block palette, wiring line connection tool, annotation tool, formatting tool, attribute editing tool, save/load tool and publishing tool. The block palette is a library of all the pre-defined blocks available to the user when they are building the block diagram. Individual users may be able to customize this palette to: (a) reorganize blocks in some custom format, (b) delete blocks they do not use, and (c) add custom blocks they have designed. The palette allows blocks to be dragged through some human-machine interface (such as a mouse or keyboard) from the palette on to the window (i.e., model canvas). The graphical version of the block that is rendered on the canvas is called the icon for the block. There may be different embodiments for the block palette including a tree-based browser view of all of the blocks.

The wiring line connection tool allows users to draw directed lines that connect the ports of blocks in the model's window. Lines are also added through various mechanisms involving human-machine interfaces such as the mouse or keyboard. Simulink® also provides various forms of auto-connection tools that connect blocks automatically on user request to produce an aesthetically pleasing layout of the block diagram (especially those with high complexity with large numbers of blocks). The annotation tool allows users to add notes and annotations to various parts of the palette for a block diagram. The formatting tool enables users to perform various formatting operations that are generally available on any document editing tool. These operations help pick and modify the various graphical attributes of the block diagram (and constituent blocks) such as include font-selection, alignment & justification, color selection, etc. The block diagram and all the blocks within the block diagram generally have a set of functional attributes that are relevant for the execution or code-generation. The attribute editing tool provides GUIs that allows these attributes to be specified and edited. The save/load tool allows a created block diagram model to be saved. The saved model can be reopened in the editor at some later juncture through a load mechanism. Simulink® also allows users to save blocks including pre-constructed sub-systems into a separate class of block-diagrams called libraries. Such libraries facilitate reuse of the same block in a number of other block diagrams. The load/save mechanism is specially equipped to handle loading and saving of blocks in a block-diagram that actually reside in libraries.

The publishing tool enables the viewing of the block diagram as a document that can be published in any of the standard document formats (examples: PostScript, PDF, HTML, etc.). Those skilled in the art will recognize that the windows for multiple models and all of the tools mentioned above could potentially be embedded in a single Multi-Document Interface (MDI) for providing a unified software environment.

Those skilled in the art will also recognize that block-diagram packages offer scripting languages for writing out programs that automatically carry out a series of operations that would normally require interaction with the GUI. For example, Simulink® offers a set of commands in MATLAB for carrying out operations such as block addition (add_block), block deletion (delete_block), starting and terminating execution (set_param), modifying block attributes (set_param/get_param), etc.

Simulink® also offers a variety of other GUI tools that improve the ability of users to build and manage large block diagrams. Examples of such GUIs include: (a) a Finder that helps find various objects such as blocks and lines within a block-diagram, (b) a Debugger that helps debug the execution of block-diagrams, (c) a Revision Control UI for managing multiple revisions of the block-diagram, and (d) a Profiler for viewing timing results while executing a block-diagram.

A typical base data-structure for a block may be represented as:

```
class Block {
    public:
        // Access methods for setting/getting block data
        ...
        // Methods for block editing
        virtual ErrorStatus BlockDrawIcon( );
        virtual BlockParameterData BlockGetParameterData( );
        ...
        // Methods for block compilation
        ...
        // Methods for block execution
        ...........................................
        virtual ErrorStatus BlockOutput( ) = 0;
        virtual ErrorStatus BlockDerivative( ) = 0;
        virtual ErrorStatus BlockUpdate( ) = 0;
        ...
    private:
        BlockGraphicalData blkGraphicalAttributes;
        BlockFunctionalData blkFunctionalAttributes;
        BlockCompiledData blkCompiledAttributes;
        BlockExecutionData blkExecutionData;
        ...
};
```

Although the example of the data structure above is written in C++, those skilled in the art will recognize that equivalent data structures written in other languages may also be used. The major data fields of the block data structure fall into four categories, a graphical attributes field, a functional attributes field, a compiled attributes field and an execution data field.

The graphical attributes field is responsible for storing information relevant for graphical rendering of the block within its parent block diagram's GUI. Attributes specific to the block icon such as font, color, name, and icon-image are stored in this field. It should be noted that modifying these attributes does not affect the dynamics of the model using this block. The functional attributes field is responsible for specifying block attributes that may potentially affect the dynamics of the model using this block. These attributes are specified for the block as a whole and the input and output ports of the block. Examples of block attributes include block sample times and restrictive flags. Block sample times specify if the block corresponds to an elemental, continuous, discrete, or hybrid dynamic system. If the block is an elemental discrete-time system, then the attribute specifies the spacing between time instants at which the block response should be traced. A restrictive flag disallows the use of blocks in certain modeling contexts. For example, one may impose the restriction that there may only be one instance of given block in a model.

Attributes of block ports specify properties of the data that is either available or produced at that port. Block port attributes include dimensions, datatypes, sample rates, and direct feedthrough. Dimension attributes are individual dimensions of a multi-dimensional matrix that is used as a container for data elements. Datatype attributes are the datatype of each element of data in the data container. A complexity attribute is a flag to specify if each data element is real or complex. A sample rate attribute specifies how when the signal corresponding to an input or output port will be used. The port sample times may sometimes be used to implicitly infer the block's sample time. The direct feedthrough attribute is specified only for input ports and indicates whether or not the Output and/or GetTimeOfNextHit equations of the block are a function of the given input. This attribute helps in determining the sequence in which block methods should be executed while executing the block diagram.

The compiled attributes field of the block data structure holds the attributes of the block and its ports that mirror the functional attributes listed above. This field is filled in during block diagram compilation by utilizing the functional attributes of the block in conjunction with the functional and compiled attributes of the blocks that are connected to it. This process of determining the compiled attributes from the functional attributes is termed attribute propagation. Attribute propagation is described in greater detail below in the section on block diagram compilation. The execution data field is mainly responsible for storing the memory locations that are going to serve as sources for block inputs, outputs, states, parameters, and other work areas during execution of blocks.

The block data structure also has a set of associated methods that may be categorized as access methods to data fields, methods used in editing, methods used in compilation and methods used in execution. Access methods to data fields help in setting and getting the various data fields of the block. Methods used in editing are called by the block diagram editor in order to render the block appropriately in the GUI of its parent block diagram. For instance, this set of methods may include a BlockDrawIcon method that determines the shape the block icon has on the GUI. Methods used in compilation are methods that are called by the block diagram compilation engine. They help validate the connections of the block to other blocks on the block diagram. The methods used in execution include a number of different run-time methods that are required for execution. These include the BlockOutput, BlockUpdate, BlockDerivative methods that realize the Output, Update, and Derivative equations discussed earlier in the context of dynamic systems. In addition to these methods, Simulink® includes several other run-time methods, such as the Jacobian, Projection, ZeroCrossings, Enable, Disable, Initialize, EvalParams (check and process parameters), and GetTimeOfNextHit methods. It should be noted that there is no explicit method for algebraic equations because these are represented and processed in a different manner which will be discussed below.

The base data structure for the block specifies the generic fields and interfaces that need to be supported by a block. Some of the methods are purely virtual and have no specific implementation in the base block class. In order to define a specific block (such as an Integrator block), one needs to subclass the base block class and provide explicit definitions for these virtual methods. An example of the subclassing of a block may be seen by examining an Integrator block. FIG. 3 depicts the desired behavior of an Integrator block 30. In order to create the subclass, four major categories of information within the subclass must be specified, the block parameters, the methods used in editing, the methods used in compilation, and the methods used in execution. The elemental dynamic system embodied by the block may be parameterized as illustrated in FIGS. 1A–1C. Each block needs to be able to specify its list of expected parameters. The block diagram editor's Attribute-Editing tool may allow users to specify the parameters for the block when they use it in their models. In the Integrator block example, the block has one parameter that specifies the block's initial condition for the block's state. Regarding the methods used in editing, the subclass needs to specify a method that renders its icon. For example, the Integrator block may implement a method that makes its icon be a box with a '1/s' within the box. Also, the subclass needs to instantiate a method that allows access of the block parameters from the GUI's Attribute-Editing tool. For the Integrator example, this method would allow users to specify the Initial Condition parameter on a GUI for the block. For the methods used in compilation, the subclass needs to instantiate methods that help in the compilation of the block diagram model in which it is placed. These methods help specify the compiled information for the inputs and outputs of the block. For instance, the Integrator block may specify a method that ensures that if the input to the Integrator is a vector, then the output is a vector of the same size. For methods used in execution, the subclass needs to instantiate specific Output, Derivative, and Update methods that represent the block behavior. In the case of the Integrator block, an Output and Derivative method are needed. It should be noted that in Simulink® the Integrator block has additional methods that are not illustrated here. The Output method sets the output to be equal to the state. The Derivative method sets the derivative of the state to be equal to the input.

The specification of these four types of information for the Integrator block subclass may be shown by a reduced form of the Simulink® Integrator block:

```
IntegratorBlock : public Block {
  public:
    ErrorStatus BlockDrawIcon( ) {
      // Draw '1/s' on the icon
      ............................
    }
    BlockParameterData BlockGetParameterData( ) {
      // Return initial_condition as block data
      ............................
    }
    ErrorStatus BlockOutput( ){
      // Implement y(t) = x(t)
      ............................
    }
    ErrorStatus BlockDerivative( ){
      // Implement dx(t)/dt = u(t)
      ............................
    }
  private:
    double initial_condition;
};
```

It should be noted that block diagram software generally provides open access to the block's data structure to users of the software. This allows users to create and utilize custom block implementations in their models.

Blocks in a block diagram may be virtual or nonvirtual. The designation of a block as nonvirtual indicates that it influences the equations in the mathematical model for the dynamic system. In the context of block diagram software, it is beneficial to include other virtual blocks that do not affect the equations in the dynamic system's model. Such blocks help improve the readability and modularity of the block diagram and wield no semantic influence on the mathematical model. Examples of such virtual blocks include virtual sub-systems, inport blocks and outport blocks, bus creator blocks and From and Goto blocks.

Modularity may be achieved in a block diagram by layering the block diagram through the use of sub-systems. A sub-system facilitates layering by allowing a collection of blocks to be represented by a single block with input and output signals. The input and output signals of the sub-system are accessible to the constituent blocks within the sub-system. A sub-system is a virtual sub-system if its constituent blocks are moved back into the main block diagram model during the model's execution. Within a virtual sub-system graphical entities, called inport and outport blocks, are provided to define signal connections to the parent block diagram. These inport and outport blocks indicate a tunnel-through signal connection to the parent block diagram.

Additional types of virtual blocks include bus creator blocks and selector blocks. In large models, there may be an extensive set of lines that connect one section of a block diagram to another section. To avoid excessive clutter of lines and improve readability, there is typically a special block called a Bus Creator that helps bundle all of the lines together to form a single bus line. This single bus line then connects the two sections of the model. At the destination end of the line, a block called a Bus Selector helps un-bundle the individual lines so that they can be connected to other blocks.

Other virtual blocks include From blocks and Goto blocks that are special blocks that help avoid graphical clutter, e.g. a line that connects two distant sections of a block diagram. The line is terminated close to its originating point by a From block. At the other end, a new line is drawn from a From block that is hot-linked to the Goto block. Each Goto and From block has an associated tag that describes which blocks are connected together. An important point to be noted is that virtual blocks have neither execution data nor execution methods in their data structure.

Simulink® also provides the user with the ability to extend the simulator by providing the ability to enhance the simulator with blocks that define dynamic systems or are virtual properties. The extension is provided through a language independent API (e.g. C, C++, Ada, Fortran, Assembly, M).

As noted previously, to facilitate modeling fairly large and complex dynamic systems, Simulink® allows users to layer their block diagrams. A sub-system facilitates such layering by allowing a collection of blocks to be represented by a single block with input and output signals. The input and output signals of the sub-system are accessible to its constituent blocks. By nesting sub-systems within each other, one can create block diagrams with arbitrary layers of hierarchy. Ideally a sub-system has no impact on the meaning of the block diagram. Additionally, sub-systems provide a way of grouping blocks together and allowing other block diagram constructs to impose unified control on the constituent blocks. To enhance the modularity of sub-systems, modeling software also allows aggregated list(s) of parameters of the blocks within the sub-system to be accessed from a single GUI, and defines and displays special icons on the sub-systems. The process of defining the parameter list and the special icon is called masking a sub-system.

There are two main types of sub-system blocks, virtual sub-systems and nonvirtual sub-systems. Virtual sub-systems serve the purpose of providing the block diagram with a graphical hierarchy. Nonvirtual sub-systems behave like an elemental dynamic system with its own execution methods (Output, Update, Derivatives, etc.). These execution methods in turn call the execution methods of the constituent blocks.

The classes of nonvirtual sub-systems are:

Atomic sub-systems. These are similar to virtual sub-systems, with the advantage of grouping functional aspects of models at a given layer. This is useful in modular design.

Conditionally-executed sub-systems. These are nonvirtual sub-systems that execute only when a precondition is fulfilled:

Enabled sub-systems. These are similar to Atomic sub-systems, except that the constituent blocks only execute when an enable signal feeding the sub-system is greater than zero.

Triggered sub-systems. These are similar to Atomic sub-systems, except that the constituent blocks only execute when a rising and/or falling signal is seen on a triggering signal feeding the sub-system.

Enable with Trigger sub-systems. These are an intersection of the properties of Enabled and Triggered sub-systems.

Action sub-systems. These sub-systems are connected to action-initiator (e.g., an "If" or "SwitchCase" block), a block that explicitly commands the sub-system contents to execute. These sub-systems are similar to Enabled sub-systems except that the management of the "enabling" signal has been delegated to an action-initiator. Action sub-systems define a new type of signal, called an action signal that signifies which sub-systems are commanded to execute by the action-initiator.

Function-call sub-systems. These sub-systems provide a means of collecting blocks into a sub-system that is only executed when called by an owner block. The owner block may compute input signals for the sub-system before calling the sub-system. Additionally, the owner may also read output signals from the sub-system after calling it. Function-call sub-systems define a new type of execution control signal, called a function-call signal that contains no data. It is used to define the execution relationship between the owner block and the function-call sub-system. Function-call owners may also designate themselves as an "interrupt" source. In simulation, they simulate the effects of an interrupt and in code generation they can attach themselves to an (asynchronous) interrupt.

While sub-systems and For sub-systems.

These sub-systems execute the constituent blocks multiple times on a given time step.

Simulink® allows for several forms of block parameters to be defined. There are two general categories of parameters: those parameters that can be modified during simulation and those that cannot be modified. An example of a parameter that may be modified during simulation is the amplitude of a Sine Wave block if configured by the user to allow modification during execution. A parameter such as the amplitude specifies coefficients of the dynamic equation, in this case the amplitude of the sine wave function defined by the Sine Wave block. An example of a parameter that can never be modified during simulation is the sample time of the Sine Wave block. The parameters that can be modified during simulation are further broken down into other categories which include mapping the dialog parameter (e.g. the amplitude) to run-time parameters or converting the dialog parameter to an inlined (non-modifiable) parameter. Run-time parameters can further be mapped to mathematical expressions of tunable Matlab variables or Matlab parameter objects describing properties of the variables (called Simulink®.Parameter's). A global run-time parameter data structure is used within Simulink® to manage the block parameters during the execution of the model.

In addition to block parameters, there are model-wide parameters that are generally associated with the solver. These parameters include aspects such as the time span in which to perform a simulation, the type of solver, and the time span. Simulink® gives the user the ability to adjust solver parameters during model execution. The adjustment of these solver parameters is performed at the start of a time step.

Once a block diagram model has been constructed using the editor, an execution engine allows the model to be solved in order to trace the system outputs as a function of time. The solution of the model, which may be referred to as model execution, is carried out over a user-specified time span for a set of user-specified inputs. Simulation proceeds in four major stages: compilation, link, code generation, and the simulation loop. Alternatively, the execution engine can obtain a linear representation of the model (linearization). The interrelationship between the various stages is illustrated in a flowchart in FIG. 4.

The execution begins when the block diagram 40 is compiled 42. Following the compilation stage, is the model link stage 44 which may also produce linear models 46. Code may or may not be generated 45. If code is generated 48, a decision is made 49 whether to continue the simulation. If the decision is made to continue the simulation the model is simulated/executed through the Simulation Loop 50. If the simulation is not continued, the code may be delivered to a target 52 and executed in an external mode 54. If code is not generated the block diagram may execute in interpretive mode when entering the Simulation Loop 50.

The compile stage marks the start of model execution and involves preparing data structures and evaluating parameters, configuring and propagating block characteristics, determining block connectivity, and performing block reduction and block insertion. The preparation of data structures and the evaluation of parameters creates and initializes basic data-structures needed in the compile stage. For each of the blocks, a method forces the block to evaluate all of its parameters. This method is called for all blocks in the block diagram. If there are any unresolved parameters, execution errors are thrown at this point.

During the configuration and propagation of block and port/signal characteristics, the compiled attributes (such as dimensions, datatypes, complexity, or sample time) of each block (and/or ports) are setup on the basis of the corresponding functional attributes and the attributes of blocks (and/or ports) that are connected to the given block through lines. The attribute setup is performed through a process during which block functional attributes "ripple through" the block diagram from one block to the next following signal connectivity. This process (referred to herein as "propagation"), serves two purposes. In the case of a block that has explicitly specified its block (or its ports') functional attributes, propagation helps ensure that the attributes of this block are compatible with the attributes of the blocks connected to it. If not, an error is issued. For instance, if an Integrator block is implemented to only accept numbers of double precision datatype, then this block will error out if it is driven by a block that produces single precision data, unless the user has asked for an implicit data conversion. Secondly, in many cases blocks are implemented to be compatible with a wide range of attributes. Such blocks adapt their behavior in accordance with the attributes of the blocks connected to them. This is akin to the concept of polymorphism in object-oriented programming languages. For instance, a discrete-time Filter block could be implemented to accept any of the standard integer datatypes ranging from 8-bit to 128-bit. The exact implementation of the block is chosen on the basis of the specific block diagram in which this block finds itself. Included within this step are other aspects such as validating that all rate-transitions within the model yield deterministic results and that the appropriate rate transition blocks are being used.

The compilation step also determines actual block connectivity. Virtual blocks play no semantic role in the execution of a block diagram. In this step, the virtual blocks in the block diagram are optimized away (removed) and the remaining nonvirtual blocks are reconnected to each other appropriately. This compiled version of the block diagram with actual block connections is used from this point forward in the execution process Once actual block connectivity has been determined (by removing the virtual blocks) the block diagram may be further optimized by performing block reduction and insertion. During this step, nonvirtual blocks may be inserted or a set of nonvirtual blocks may be completely removed or reduced to a single equivalent block. Block insertion and reduction is mainly done to improve execution efficiency. Examples of block insertion and reduction include the removal of Gain blocks whose gain value is 1.

A Gain block is a block that multiplies its input value by a gain parameter, such as a simple amplifier. FIG. 5 depicts the replacement of a collection of blocks 60, 62, and 64 connected in a accumulator pattern and leading to result 66 with an equivalent synthesized block 68 representing the accumulator pattern leading to the same result 66. A signal copy block may also be automatically inserted in order to make contiguous memory copies of signals that are made up of disjoint memory sections. Block insertion and reduction may also be performed at other suitable stages of compilation.

The way in which blocks are interconnected in the block diagram does not necessarily define the order in which the equations (methods) corresponding to the individual blocks will be solved (executed). The actual order is partially determined during the sorting step in compilation. Once the compilation step has completed, the sorted order cannot be changed for the entire duration of the block diagram's execution.

The first step in sorting involves transforming the graphical block diagram into a compiled (in-memory) directed graph consisting of arcs and vertices. The vertices are derived from some of the nonvirtual blocks. For instance, virtual and reduced blocks do not appear in the directed graph. The arcs represent data dependencies between the vertices. The data dependencies do not correspond to the signals in the block diagram. For example, all signals that connect to input ports without direct feed through are "cut" or ignored. In addition, data dependencies are added to capture implicit dependencies. For example, all inputs to a Function-Call sub-system are implicit data dependencies to the owner (caller) block.

The process of converting a block diagram into a compiled directed graph is shown in FIG. 6A. A block diagram 81 includes a Sine Wave 1 block 82, a Sine Wave 2 block 84, a Goto block 86, a Function Call Generator block 88, and a From block 90. Also included are a Function Call Sub-system block 92, a Sum block 94, a Gain block 96, an Integrator block 98 and an Outport (Output 1) block 100. Those blocks that are not virtual or reduced appear on the corresponding directed graph 111. The directed graph 111 includes a Sine Wave 1 vertice 112, a Sine Wave 2 vertice 114, a function-call generator vertice 116, and a function call sub-system vertice 118. Also included are a Sum vertice 120, a Gain vertice 122, an Integrator vertice 124 and an Outport 1 vertice 126. The vertices are connected by arcs.

The graph is used to sort the blocks into a linear sorted list. FIG. 6B depicts a sorted list 128 generated from the compiled directed graph 111 which includes the elements appearing as vertices in the directed graph 111 sorted into order. The root block diagram has a sorted-list associated with it. Roughly speaking, each nonvirtual sub-system layer and some special block diagram elements also each have their own sorted-list. During the sorting of the graph into the list, strongly connected components are identified. The term strongly connected section, which is a term that originates from graph theory, is a subset, S, of the blocks of a block diagram such that any block in S is reachable from any other block in S by following signal connections and S is not a subset of any larger such set. Strongly connected sections are flagged as algebraic loops when all blocks have direct feedthrough (an example is shown in FIG. 6A consisting of the Sum 120 and Gain 122 blocks). Such loops correspond to a set of algebraic equations and are solved using iterations and perturbations during block diagram execution by solving for the algebraic variables. Algebraic variables are either specified by the user via Initial Condition blocks or chosen by the execution engine. Solving of algebraic loops is discussed further below.

Sorting must also take into consideration other user specified dependencies between the blocks. These dependencies include the concepts of priorities and placement groups. A block priority specifies the order in which the equations associated with a block are evaluated with respect to other blocks. Placement groups are a way of causing each class of block methods for a specified set of blocks to be "placed together" in the block method execution lists. The terms "data dependency" or "data precedence" as used herein refers to the arcs of the compiled directed graph and not the signals found within a block diagram. Attempting to correlate data dependencies directly to the signals found within a block diagram is incorrect and leads to the conclusion that Simulink® does not satisfy data dependencies, i.e., the execution of the operations or block methods does not satisfy data dependencies if one interprets signal connectivity as specifying data dependencies.

After compilation, the link stage commences. During this stage physical memory allocations are made in order to prepare for execution. Buffers are allocated for block input and output data buffers, states, and work areas. Additionally, block method execution lists that are derived from the sorted list allow for execution of the block diagram. Each block method execution list is a list of block methods that are to be executed in a sequence when each method within the list has a sample hit. There is generally a set of block method execution lists associated with each layer of the block diagram that corresponds to a nonvirtual sub-system. Non-virtual sub-systems are either defined by the user or automatically synthesized during compilation to either efficiently execute the model or simplify the implementation of the semantics defined by Simulink®. In multi-tasking mode, the lists within each layer may be further partitioned when block diagrams have blocks with different sample rates. These lists are explained in greater detail below.

Those skilled in the art will recognize that while the block method execution lists are derived from the sorted list, they do not necessarily correspond one-to-one with the sorted lists. First, each block method execution lists contains only blocks that have such a block method of the given type (class) defined by the list. Second, block methods corresponding to components like the function-call sub-system do not appear on the block method execution lists because they are executed by an "owner" block.

Although included in the discussion of the compilation stage, it is not required that the time-based diagram perform the block sorting step during compilation. The sorting step is performed to achieve efficient execution. Ignoring efficiency, there is no semantic reason to perform the sorting step. Any random ordering of the block methods will work. In fact, any ordering of all block method execution lists except the Output block method execution list will result in the same level of efficiency. Randomly re-ordering the Output block method execution list will yield correct answers. If the Output block method list is randomly ordered, then the Simulation engine, when executing the Output block method execution list, continues sequencing through the Output block method execution list at each point in time until there are no changes.

Similarly included within the linking stage for the sake of simplicity, is the memory initialization of the model. The memory initialization of the model includes invoking block start, initialize, constant initialize, enable, and constant output methods. These are examples of some of the block methods that are used during model setup (prior to execution) to initialize the "state" of the system so that execution or linearization can commence.

The compiled and linked version of the block diagram may be directly utilized to execute the model over the desired time-span. This interpretive mode of execution is suitable for getting fine-grained signal traceability. It should be noted that the traceability associated with interpretive execution comes at the price of increased overhead in the form of additional execution-related data-structures and messaging in the engine. An alternative to the interpretive execution mode is to utilize the generated-code created by Real-Time Workshop tool for Simulink® models. In this mode, the engine (upon the behest of the user) translates a selected portion of the block diagram (or the entire block diagram itself) into code. Such code could be in a number of possible forms. The code may be instructions in a high-level software language such as C, C++, Ada, etc., hardware descriptions of the block diagram portions in a language such as HDL, or custom code formats suitable for interpretation in some third-party software. Alternatively, the code may be instructions suitable for a hardware platform such as a microprocessor, microcontroller, or digital signal processor, etc., a platform independent assembly that can be re-targeted to other environments, or just-in-time code (instructions) that corresponds to sections of the block diagram for accelerated performance.

The execution of a portion of the block diagram represented in code may be performed in a number of different ways based on the specific code format. The portion of the block diagram may execute a compiled version of the code generated in a high-level language (accelerated or software-in-the-loop simulation), the execution may simulate code that corresponds to a hardware description on a hardware simulator, (co-simulation execution), the execution may involve calling out to third-party software to run code generated for such software (co-simulation execution), or the execution may call out directly to hardware that will run code that was generated and compiled for that hardware (processor-in-the-loop execution).

There are several different advantages to execution through code generation: Execution of generated code can be more efficient than interpretive execution because of fewer data-structures and lesser internal messaging in the engine, although the increased efficiency generally comes at the cost of decreased execution traceability. Simulation of hardware descriptions during execution can help identify and resolve bugs in the software stage of a design project. Such bugs prove much more expensive to track and fix once the system has been implemented in hardware. Additionally, block diagram modeling software can be integrated with other software environments that are suitable for modeling and simulating special classes of systems. Models can be tested directly in hardware thereby making prototyping of new systems fast and cost-effective. For instance, consider the design of a controller for an anti-lock braking system of a car. The dynamics of the braking system can be executed in the interpretive mode in the block diagram. The controller itself can be implemented on a hardware micro-controller to test the efficiency of the control laws implemented within. Note that for such target execution, it is normally necessary for the time span over which a model is executed by the software to match real-world time. In other words, the software must allow real-time execution of the block diagram model. Those skilled in the art will recognize that when users generate code, they may choose to not proceed further with the block diagram's execution. They may choose to take the code and deploy it outside of the confines of the modeling software environment. This is normally the last step in the design of dynamic systems in a block diagram software package.

There are several forms of target code execution known to those skilled in the art such as Rapid Prototyping, Embedded System Deployment, and Hardware-in-the-Loop which execute a model or portions of a model via the generated code on a Real-Time System target. One aspect of deploying (executing) the generated code on a target is the notion of "external mode." External mode refers to a system where Simulink® acts as a monitor and debugger of the generated code running in real-time on a target. In External Mode, users can change parameters and view signals via standard Simulink® elements. Another important aspect of the code generation technology is that it is very extensible. Provided with the Simulink® product family is the Target Language Compiler (TLC). This technology enables the creation of "active scripts" that control how the generated code is produced for a block diagram. Using TLC, one can tailor the generated code to suit their specific needs.

The execution of the block diagram uses a Simulation Loop (SimLoop) for solving for the block diagram's outputs for a specified set of inputs over a specified span of time ("Time" in reference to the Simulation Loop means the time-line corresponding to the tracing of the dynamic system's outputs, not real-world time unless otherwise noted). The term "SimLoop" applies to real-time systems where each iteration is tied to a physical periodic clock or other timer source. During this process, the block methods (equations) corresponding to the individual blocks are executed by type following their sorted order when they have a sample hit. The term "block execution" is loosely used to mean executing all block methods associated with the given block for a given time step, generally starting with the output method. Strictly speaking, blocks do not execute; the engine executes (evaluates) the appropriate block methods at the appropriate time points.

SimLoop has two variants "single-tasking" and "multi-tasking" depending on sample times. In general, the sample time of a block is the interval of time between calls to the Output, Update, and/or Derivative methods for a given block. In computing this interval, repeated calls at the same time instant (not in real-world time but the time corresponding to the execution of the dynamic system) are counted as the same call. A block's sample rate may also be thought of as the interval between successive executions of the block methods. If there is no uniform or regular interval between calls, then the block is said have a continuous sample time. If a uniform time interval can be found, then the block is said to have a discrete sample time equal to that interval. Although blocks may be associated with more than one sample time in a sufficiently complex dynamic system the descriptions contained herein are confined to blocks with a single sample-time. Those skilled in the art will recognize that the descriptions may be extended to encompass blocks with multiple sample times.

FIG. 7A depicts an abstract example of a block diagram being executed. The diagram includes a plurality of blocks 140, 142, 144, 146, 148 and 150. The block ports that have direct feedthrough are explicitly marked (using the symbol 'df') 152. Additionally, an abstract view of the execution methods instantiated by each block is shown in FIG. 7B. The blocks contain a number of different methods 160, 162, 164, 166 and 168. Execution methods includes the three basic execution methods discussed earlier: Output, Update, Derivative, as well as several other methods that aid in advanced block functions such as initialization, linearization and zero-crossing detection.(which are discussed below). The data-dependencies between the compiled vertices created during sorting are used to generate the Sorted List 170 shown in FIG. 7C.

A block diagram consisting of blocks that all have the same sample time is said to correspond to a single-rate system. A block diagram consisting of blocks that have more than one sample time corresponds to a multi-rate system. FIG. 8 depicts a multi-rate system, adding sample-time information to the block diagram of FIG. 7A. The plurality of blocks 140, 142, 144, 146, 148, and 150 each have an associated sample time. Since the sample times in the block diagram differ between blocks, the system is considered a multi-rate system. Block A 140, block E 148 and block F 150 each have a sample time of 0.1 seconds. Block B 142, block C 144 and block D 146 each have a sample time of 1.0 seconds.

The SimLoop is the heart of the execution engine. Each full pass through the loop is responsible for computing the outputs of the system at a particular time. At the end of each loop, the execution time corresponding to the next pass through the loop is computed. If this time exceeds the stop time specified by the user, the execution terminates. Within the loop, the sequence in which individual block equations are solved is determined by two pieces of information: the sample times of the blocks and the sorted order determined during the Compile stage. The amalgamation of these two pieces of information gives the execution lists for the block diagram. Those skilled in the art will recognize that the execution lists are created in the Link stage and are explained in the context of SimLoops for convenience. There are two distinct approaches for building execution lists and using them in the SimLoop. These approaches correspond to the Single-tasking and Multi-tasking SimLoops summarized in the discussion on FIG. 10 below.

Simulink® also has the ability to modify coefficients (parameters) of blocks that declare their parameters as tunable. An example of such a block is a Sine Wave block that implements the function: output (time)=amplitude*sin (frequency*time+phase) +bias, where time is the independent variable and the parameters are: amplitude, frequency, phase, bias. When these parameters are declared as tunable, Simulink® lets the user change these coefficients during simulation. Changing parameters is a drastic operation in that the definition of the model has changed (e.g. the sine block defines equations that describe the system). Thus, to enable the changing of parameters during the SimLoop®, Simulink® first queues parameter changes and then applies them on the next time step. Thus, the changing of parameters is not immediate. The delay in the changing of parameters is needed to ensure system stability. The application of the parameters at the start of the next time step is combined with the reset of the solver (Integrator) if needed.

For the purpose of exploring single-task loops and multi-task loops, FIG. 9 depicts the block diagrams of FIG. 7A and FIG. 8 where Method1 corresponds to the Output method 190 and Method2 corresponds to the Update method 192. All other methods are ignored in the explanation of the loops. Simpler loops which do not include blocks that have continuous sample times are used in the example since the explanation is simpler in the context of discrete sample times and it is straight-forward to extend to continuous sample times.

In a single-tasking SimLoop, there is essentially a single execution time-line. On this time-line, each block is executed when it has a sample hit. A sample hit is defined to be an execution time instant that is an integer multiple of the block's sample time. To aid in execution, execution lists are constructed for each method type. FIG. 10 depicts the sequence of steps followed by a single-tasking execution loop. Following initialization (step 200), a time parameter is checked to see if the current time is less than the stop time (step 201). If the time is not less than the stop time, the simulation ends (step 202). If the time is less than the stop time, the simulation continues and the root output method execution list is executed (step 204). Following execution of the output method list (step 204) the update method execution list is executed (step 206). Following the performance of an integrate step (208) (the Integrate step is described in more detail below in FIG. 14), the time parameter is incremented by the applicable step size (step 210).

Blocks are arranged in the single-tasking execution lists in the sorted order as shown in FIG. 11A. A sorted list 250 is used to generate an Output method execution list 252 and an Update method execution list 254. Referring back to the example in FIGS. 7 and 8, the engine sequentially steps through and execute each block in the block method execution list when the execution time divided by the sample time equals an integer number (1, 2, 3, 4, etc.). At time zero ($T_0$), all the blocks are executed. This involves executing the Output methods for blocks F, E, D, A, B, and C (in this order as dictated by the sorted list) and then executing the Update methods of blocks F, E, and D (again, in this order based on the sorted list). The execution time then is then incremented by step size, which in this case is assumed to be 0.1 seconds. Execution then commences once again at the top of the loop for T=0.1 ($T_{0.1}$). Blocks F and E have a sample time of 0.1 seconds and have a sample hit ($^{0.1+0.1=1}$, sample time is an integer multiple of the execution time), so the output block methods for Blocks F and E are executed. Block D, however, has a 1.0 second sample time and has no sample hit (0.1÷1.0=0.1, sample time is not an integer multiple of the execution time), so its output block method is not executed (essentially it is skipped). Block A, like Blocks F and E, has a 0.1 second sample time and so its output block method is executed. Blocks B and C, like Block D, have 1.0 second sample times and are skipped during this iteration of the simulation loop, which completes execution of the output block method execution list for $T_{0.1}$.

The execution timing of the example block diagram in single task mode is shown in the first time-line of FIG. 11B. In this diagram, note that the execution-time is not synchronized with real-world time. Instead, execution time progresses as fast as it can in real-world time. The sorted list 259 is executed on the time-line 260. The methods in the list 262 are executed at the appropriate time step 264. Block diagram modeling software can also allow users to simulate real-world conditions by synchronizing execution time with real-world time. Such execution is illustrated in the second timing diagram of FIG. 11B. The methods 262 are implemented at a time-step 264 synchronized with real world time on the time line 270.

In multitask mode, the engine performs execution along multiple time-lines based upon the number of block sample times used in the mode as shown in the flowchart of FIG. 13. In the example of FIGS. 7 and 8, the model's blocks have a sample time of either 0.1 seconds or 1.0 second. This implies that the engine runs one set of blocks along a 0.1 second time line and another set of blocks along a 1.0 second time line. In order to run in multitask mode, the execution lists are first divided on the basis of methods (as in single-tasking mode) and then subdivided again based upon block sample times. This is illustrated in FIG. 12A. The sorted list 280 is used to generate an output method execution list 282 and update method execution list 288. The output method execution list 282 is split into two separate list execution lists 284 and 286 based on sample times. Similarly, the update method execution list 288 is divided into two update method execution lists 290 and 292 based on sample times.

The execution engine uses the divided execution lists to create multiple execution time lines. In the multitask mode the engine places a higher execution priority on the faster sample time blocks than the slower sample time blocks. This prioritization is carried out by assigning Task Identification Numbers (TIDs) to each execution list; the higher the priority, the lower the TID. For example, a TID of 0 executes at a higher priority than a TID of 1, and so forth. Furthermore, because, during execution in multitask mode, execution transitions between the faster and slower blocks, and vice-versa, the multitask mode requires rate transition blocks that allow the model to transition from blocks running at fast sample times, in our example 0.1 seconds, to slower samples times, e.g., 1.0 seconds. The rate transition blocks are required to correctly simulate how a multi-rate system would behave in a real-time environment. To provide this transition, the engine promotes rate transition blocks to the TID of the fast block for which transition is being provided, although the engine executes these rate transition blocks at their slower rate. This is why Blocks D and B appear in the 0.1 sample time output method execution list in FIG. 12A.

The execution of our example in the multi-task mode may be seen in FIG. 12B. At time T=0, the engine first executes the high priority output methods (those with TID 0) for Blocks F, E, D, A and B, then it executes the high priority update methods (those with TID 0) for Blocks F and E. After finishing the high priority blocks, the engine executes the lower priority output block methods (those with TID 1) for Block C, and then executes the lower priority update methods (those with TID 1), which, in this example, is Block D. In contrast to the single task mode, in multitask mode the engine runs through a TID inner loop to execute the output and update block methods before going on to the Integration step, as the flow chart in FIG. 13 which is discussed below illustrates.

As a result of the inner TID loop, as well as the segregated block method execution lists, the order of execution in multitask mode differs from the order of execution in single task mode. Recall for the example that in single task mode that the order of execution at T=0 is: $F_o$, $E_o$, $D_o$, $A_o$, $B_o$, $C_o$, $F_u$, $E_u$, and $D_u$, where the subscript "o" stands for output method and the subscript "u" stands for update method. In the multitask mode, however, the order of execution at T=0 is: $F_o$, $E_o$, $D_o$, $A_o$, $B_o$, $F_u$, $E_u$, $C_o$, and $D_u$. Notice that $C_o$ is executed in a different order in multitasking mode. This occurs because separate method execution lists (based upon sample time) are created and run in order from fastest sample time to slowest sample time. Additionally, the use of rate transition blocks restricts the connection of blocks with different rates. By requiring the insertion of these blocks into the model, the engine ensures that execution in multitask mode will follow the sorted list.

After it is finished executing the block methods for T=0, like in the single task mode, the execution time is incremented (again assume by 0.1 seconds) and execution goes to the beginning of the loop. The engine executes $F_o$, $E_o$, $A_o$, $F_u$, and $E_u$, and the engine does not execute the block methods of Blocks D, B, and C because the current execution time is not an integer multiple of those block's sample time. The engine repeats this execution until the execution time is incremented to 1.0 seconds, whereupon execution occurs in the same manner as described for T=0. The engine repeats this overall process until the execution stop time is reached.

FIG. 12B shows two time-lines; the lower time-line 306 represents the execution order of the faster sample time blocks (Blocks A, E, and F), along with the rate transition blocks (Blocks B and D), while the top time-line 308 shows the execution order of the slower sample time block (Block C), and the rate transition (Block D) update method. The time-lines are generated from the sorted list 302 and the associated sample times 304. The lower line, representing the faster sample times has a TID of 0, and the top line has a TID of 1. For execution time T=0, the chart shows that the engine executes the output methods for Blocks F, E, D, A, and B (designated on the chart as $F_o$, $E_o$, $D_o$, $A_o$, $B_o$). Then, consistent with the flow chart for the multi-tasking mode (see FIG. 13 discussed below), the engine executes the update block methods for Blocks F and E (designated $F_u$, and $E_u$). Once the engine is finished with the high priority block methods, the output method for Block C ($C_o$) and the update method for rate transition block D ($D_u$) are executed. The execution time is then incremented by the step size (continue to assume 0.1 seconds) and the blocks that have a sample hit are executed. The figure shows execution of $F_o$, $E_o$, $A_oF_u$, and $E_u$, which is repeated, as noted above, until execution time equals 1.0 second. Notice, like in the non-real-time case for Single-task mode, the engine does not wait for time to elapse; rather it executes block methods immediately upon completion of the previous pass through the loop.

FIG. 13 shows the overall sequence of steps taken by Simulink® in multitask mode. Following initialization (step 220), the output method execution list is executed for the fastest sample time (step 222). The update method execution list is then executed for the fastest sample time (step 224). A time time parameter is checked (step 225) to determine if the time is less than a designated stop time. If the stop time has been reached, the simulation completes (step 226). Otherwise, the integrate stage (step 228) is performed. The task ID variable is incremented (step 230) and compared to a parameter of the number of sample times (step 231). If the task ID is less than the number of sample times, the output method execution list for the methods assigned the new task Id are executed (step 232) followed by the execution of the update method execution list assigned the new task ID (step 234). The task ID variable is incremented and the process iterates with the task ID being compared to the number of sample rate times (step 231). When the task ID number is determined to equal the number of sample rate times, the simulation time is incremented (step 238) and the entire process iterates with the output method list execution list (step 222) being executed for the fastest sample times. The process continues until the end of simulation when the time equals the stop time (step 226).

In order to understand how the step size is picked within SimLoop, it is first necessary to understand the notion of a solver. The solver is a module of the execution engine that is responsible for performing two tasks: (a) determining how far execution time should be advanced between consecutive passes through the SimLoop in order to accurately trace the system's outputs, and (b) integrating the derivative of the states of the system to obtain the actual states. Based on how solvers perform the first task, they are generally classified into two basic classes: Fixed-step solvers or Variable-step solvers.

Fixed-step solvers are solvers in which the time step-size between consecutive passes through the SimLoop is a fixed quantity. The user generally explicitly specifies this quantity. These solvers are used to model types of systems that must operate within a defined time (discrete systems). For instance, an anti-lock braking system may be designed to control a car's braking system, and to execute such control in one-one hundredth (0.01) of a second so as to assure the car stops safely; if the braking system does not meet its timing constraints, the car may crash. Fixed-step solvers, therefore, are designed to help model discrete systems that have to generate a result in a fixed time period, and the fixed-step execution assures that the modeled system can generate such results.

Variable-step solvers are designed to model continuous systems where non-evenly spaced time steps are needed to simulate all significant behavior. For example, one may want to simulate the path of a bouncing ball, where it bounces, how high it bounces, and where it stops. It is known, based on experience, that the ball's bounces will not be evenly spaced, and that the height of the bounces will diminish as a result of gravity, friction, and other forces. Variable-step solvers are used for these types of continuous systems and to determine what step size to use so that the behavior of the ball will be accurately modeled.

The two broad classes of solvers are further subdivided based on the integration task they perform. There are several algorithms for carrying out numerical integration. The particular choice of the integration algorithm gives rise to the subclasses of solvers.

The difference in the conceptual definition of Fixed- and Variable-step solvers leads to the functional difference in the context of the SimLoop. The major difference between the solvers arises in the Integrate step of the SimLoop which is depicted in FIG. 14. During the Integrate step, the Variable-step solver executes the Output and Derivative block method lists for a number of iterations that varies based on the solver subclass (i.e., the numerical integration algorithm it uses) and integration error tolerances. In a fixed-step solver, the number of iterations is fixed for a given solver subclass. Another difference between solvers arises in the Integrate phase in the context of an operation known as zero-crossing detection. Zero-crossings in the derivatives of the state generally indicate a discontinuity in the states themselves. Because discontinuities often indicate a significant change in a dynamic system, it is important to trace the system outputs precisely at such points. Otherwise, the outputs of the model could lead to false conclusions about the behavior of the system under investigation. Consider, again the example of the bouncing ball. If the point at which the ball hits the floor occurs between simulation steps, the simulated ball appears to reverse position in midair. This might lead an investigator to false conclusions about the physics of the bouncing ball. To avoid such misleading conclusions, it is important that the execution has time steps on and around the vicinity of discontinuities.

In the case of Fixed-step solvers, there is no notion of zero-crossing detection and one is not guaranteed to find all points of discontinuity. One can only keep reducing the step-size to increase the probability of hitting the discontinuity. Contrastingly, in the case of Variable-step solvers, the Integrate step explicitly includes zero-crossing detection. The execution step size is then adjusted accordingly to ensure that discontinuities are tracked accurately. To enable zero-crossing detection, blocks that can produce discontinuities instantiate a special execution method. This method registers a set of zero-crossing variables with the execution engine, each of which is a function of a state variable that can have a discontinuity. The zero-crossing function passes through zero from a positive or negative value when the corresponding discontinuity occurs. During the zero-crossing detection phase of the Integration step, the engine asks each block that has registered zero-crossing variables to update the variables for the projected time of the next time step. These variables are then checked for a change of sign since the current step. Such a change indicates the presence of a discontinuity. An iterative process then tries to narrow down the location of the discontinuity and ensure that the next few time steps (at least 2) accurately bracket the location of the discontinuity. The final difference, which is in the step-size during execution, is a direct consequence of the two previous differences in the step-size determination. In Fixed-step solvers, the step size is a known and fixed quantity. For Variable-step solvers, the step size is determined during the integration iterations and the zero-crossing detection that happens during the Integration step.

An example of the variable-step solver is shown in FIG. 14, the derivative method execution list is executed (step 240) followed by the output method execution list (step 242). The derivative method execution list is then executed again (step 244) and the solver iterates between the execution of the output method execution list (step 242) and the execution of the derivative method execution list (step 244). A similar iteration loop then occurs between the execution of the output method execution list (step 246) and the execution of the zero-crossing method execution list (step 248). Note that Simulink® also includes other methods such as Projections and Jacobians in this step as needed.

While it is theoretically possible to have Variable-step solvers in the context of multitasking, such a combination is not employed in practice. This is because the step-size for such solvers can become very small making it impossible to keep up with the real-time constraint that generally goes along with multitasking execution. An added complication is that the integration step in such solvers is iterative and takes varying amounts of time at each step of the execution. Therefore, Variable-step solvers are generally used only in conjunction with the Single-Tasking SimLoop. Additionally, they are not usually employed in systems that need to operate in real-time.

When a model contains an algebraic loop, the engine calls a loop solving routine at each time step. The loop solver performs iterations and perturbations to determine the solution to the algebraic condition (if it can). One possible approach to solving the algebraic equation F(z)=0, is to use Newton's method with weak line search and rank-one updates to a Jacobian matrix of partial derivatives. Although the method is robust, it is possible to create loops for which the loop solver will not converge without a good initial guess for the algebraic states z. Special blocks are generally provided to specify an initial guess of the states in the algebraic loop.

In addition to the various forms of the SimLoop, modeling packages such as Simulink® use the output of the Link stage to compute linear models through a process generally referred to as model linearization. These linear models may be used in the SimLoop at various points in the execution of the overall model. Alternatively, the linear model may be returned to the user. The linearization process involves the use of a Jacobian method defined on blocks and numerical Jacobian algorithm.

Information related to the compiled block diagram may be presented to users in an automatically generated report. This report allows users to quickly obtain documentation of the functional description of their model. Information related to the execution of a particular model (such at the time taken to execute various portions of the model and the coverage of various portions of the model) may be obtained automatically and presented to the user as a report.

Various classes of block diagrams describe computations that can be performed on application specific computational hardware, such as a computer, microcontroller, FPGA, and custom hardware. Classes of such block diagrams include time-based block diagrams such as those found within Simulink® from the MathWorks, Inc. Natick Mass., state-based and flow diagrams such as those found within Stateflow® from the MathWorks, Inc. Natick Mass., and data-flow diagrams. A common characteristic among these various forms of block diagrams is that they define semantics on how to execute the diagram.

Historically, engineers and scientists have utilized time-based block diagram models in numerous scientific areas such as Feedback Control Theory and Signal Processing to study, design, debug, and refine dynamic systems. Dynamic systems, which are characterized by the fact that their behaviors change over time, are representative of many real-world systems. Time-based block diagram modeling has become particularly attractive over the last decade with the advent of software packages such as Simulink® from The MathWorks, Inc. of Natick, Mass. Such packages provide sophisticated software platforms with a rich suite of support tools that makes the analysis, synthesis, validation, and design of dynamic systems efficient, methodical, and cost-effective.

A dynamic system (either natural or man-made) is a system whose response at any given time is a function of its input stimuli, its current state, and the current time. Such systems range from simple to highly complex systems. Physical dynamic systems include a falling body, the rotation of the earth, bio-mechanical systems (muscles, joints, etc.), bio-chemical systems (gene expression, protein pathways), weather and climate pattern systems, etc. Examples of man-made or engineered dynamic systems include: a bouncing ball, a spring with a mass tied on one end, automobiles, airplanes, control systems in major appliances, communication networks, audio signal processing, nuclear reactors, a stock market, etc. Professionals from diverse areas such as engineering, science, education, and economics build mathematical models of dynamic systems to better understand system behavior as it changes with the progression of time. The mathematical models aid in building "better" systems, where "better" may be defined in terms of a variety of performance measures such as quality, time-to-market, cost, speed, size, power consumption, robustness, etc. The mathematical models also aid in analyzing, debugging and repairing existing systems (be it the human body or the anti-lock braking system in a car). The models may also serve educational and training purposes, e.g., to explain the basic principles governing physical systems. The models and results are often used as a scientific communication medium between humans. The term "model-based design" is used to refer to the use of block diagram models in the development, analysis, synthesis, and validation of dynamic systems.

With the modeling of complex, or even simple, dynamic systems, the likelihood exists that the resulting model will include one or more algebraic loops. Algebraic loops can be described as circular dependencies between variables. If there is a circular dependency between variables, the value of each of the variables cannot be directly computed. For example, given an example set of equations as follows:

$x=y+2$ $y=-x$

The values of x and y cannot be directly computed. There are two different approaches to solving these equations. The first approach is to supply educated guesses as values of each of the variables repeatedly until a solution results. However, this is an inefficient and time consuming approach that cannot provide a fixed computational load because it relies upon iteration, and is therefore not suited for, e.g., real-time applications. Alternatively, the system of equations can be partially solved algebraically. For example, solving the system into an explicit form leads to 2x=2 and y=-x, or x=1 and y=-1.

Simulink® blocks may have input ports with direct feedthrough. This means that the values of the signals entering the blocks at their input ports have to be known when the output of these blocks, or when the time of the next sample hit, is computed. More specifically, a block has direct feedthrough if its input at time, t, must be known when its output at time, t, is computed. The ports of every block in Simulink® are flagged as either having or not having direct feedthrough. Direct feedthrough characteristics become important when Simulink® generates its sorted list of blocks. For blocks without direct feedthrough ports, such as a unit delay, the block sorting is not important because the output does not depend on the current input. Sorting is crucial for efficient execution, however, for blocks with direct feedthrough ports, as the block's input signal (i.e., the output of the block directly connected thereto), must be computed prior to its output calculation. Failure to sort blocks such that these direct feedthrough relationship hold will require multiple output method evaluations to get the correct answer, resulting in inefficient execution.

Because of the requirement that input signals to direct feedthrough ports of blocks must be computed prior to obtaining an output calculation, and despite care in sorting blocks in a block diagram model, there is a tendency for algebraic loops to occur. An algebraic loop generally occurs when an input port with direct feedthrough is driven by the output of the same block, either directly, or by a feedback path through other blocks with direct feedthrough. An example of an algebraic loop is a simple scalar loop 251 as shown in FIG. 15.

The scalar loop 251 includes a Sum Block 253 having an input u and an output z. Mathematically, the scalar loop 251 implies that the output of the Sum block 253 is an algebraic state z constrained to equal the first input u minus z (i.e. z=u−z). The solution of this simple loop is the equation "z=u/2". However, most algebraic loops cannot be solved by inspection. It is possible to create vector algebraic loops with multiple algebraic state variables z1, z2, etc., as shown in an example block diagram model 255 of FIG. 16.

In FIG. 16, an Algebraic Constraint block 257a and 257b is a conventional way to model algebraic equations and requires specification of initial guesses. The Algebraic Constraint block 257a and 257b constrains its input signal F(z) to zero and outputs an algebraic state z. The Algebraic Constraint block 257a and 257b outputs the value necessary to produce a zero at the input. The output must affect the input through some feedback path. If the user provides a better initial guess (than the default value assumed by the solver) then the algebraic loop solver can be more efficient.

A scalar algebraic loop represents a scalar algebraic equation or constraint of the form F(z)=0, where z is the output of one of the blocks in the loop and the function F consists of the feedback path through the other blocks in the loop to the input of the block. In the simple one-block example shown in FIG. 15, F(z)=z−(u−z). In the vector loop example shown in FIG. 16, the equations are:

$$z2+z1-1=0$$

$$z2-z1-1=0$$

Algebraic loops arise when a model includes an algebraic constraint F(z)=0. This constraint might arise as a consequence of the physical interconnectivity of the system being modeled. More generally, the constraint might arise because a user is attempting to model a differential/algebraic system (DAE).

When a model contains an algebraic loop, block diagram programs such as Simulink® call a loop solving routine at each time step. The loop solver performs iterations to determine the solution to the problem (if it can). As a result, models with algebraic loops have a variable computational load and no set response time.

To solve F(z)=0, a conventional loop solver, such as the one found in Simulink®, utilizes Newton's method with weak line search and rank-one updates to a Jacobian matrix of partial derivatives. Although the method is robust, it is possible to create algebraic loops for which the loop solver will not converge without a good initial guess for the algebraic states z, especially if the loop contains discontinuities. A user can specify an initial guess for a line in an algebraic loop by placing an initial condition (IC) block (which is normally used to specify an initial condition for a signal) on that line. As shown above, another way to specify an initial guess for a line in an algebraic loop is to use an Algebraic Constraint block. Thus, there is a recommendation that whenever possible, an IC block or an Algebraic Constraint block be used to specify an initial guess for the algebraic state variables in a loop. Alternatively, a user must try to solve the algebraic loop, or re-organize the blocks to eliminate the algebraic loop while still maintaining functionality. However, if not prohibitively difficult, this also can be time consuming, especially in complex systems, because of the likelihood that there are a significant number of algebraic loops to either solve or eliminate.

Artificial algebraic loops are of a different origin but have a similar manifestation. Artificial algebraic loops arise when the model designer groups blocks into inseparable units of computation that have ports with direct feedthrough and, as a result, become part of an algebraic loop. If the blocks could be executed individually, no algebraic loop would be present, therefore, the algebraic loop is deemed artificial.

To illustrate, consider the example later discussed in FIG. 18. If an example sub-system 422 is virtual (i.e., it has no implications with respect to the execution order of its internal methods), the constituents can be executed separately from one another. This allows a regular execution order. First, a Constant 421 is executed to produce its output (A). Because a Sum block 426 needs one more input (E) before it can compute its output, a Unit Delay block 432 in the Sub-system 422 computes a unit delay output (D). A Gain block 424 can then compute a gain output (E) and this allows the Sum block 426 to compute the sum output (B). Finally, a Gain block 430 computes the gain output (C).

When, however, the Sub-system 422 is required to be an inseparable unit of computation so that individual output, update, etc. methods can be defined, i.e., it is nonvirtual, the above execution order becomes invalid because the computation of the output of the Sub-system 422 constituents, i.e., the Gain 430 and Unit Delay 432, is interspersed with the computation of the output of other blocks. In such instances, the Gain 430 computes its output immediately before or after the Unit Delay 432 computes its output, thus the input to Sub-system 422 has to be available when its output is computed. Otherwise, the Gain 430 would compute its output using an incorrect value. Therefore, the input port In 1 428 of Sub-system 422 has direct feedthrough and the corresponding input-output dependency leads to an algebraic loop that is considered artificial because the loop is induced by execution constraints.

SUMMARY OF THE INVENTION

There is a need for an efficient method for resolving artificial algebraic loops automatically. The present invention is directed toward further solutions to address this need.

In accordance with one embodiment of the present invention, in an electronic device, a method of resolving an algebraic loop includes providing an executable process having a plurality of functions. The process is identified as to whether blocks with direct feedthrough ports caused by execution constraints are present. For such blocks, an artificial algebraic loop may exist in the process, and an artificial algebraic loop solution is implemented that modifies a manner by which the plurality of functions forming the potential artificial algebraic loop execute.

In accordance with aspects of the present invention, the artificial algebraic loop solution includes rerouting at least one of a model update function, a derivative function, and a zero-crossing function to execute a model output function to obtain output from the direct feedthrough plurality of functions and subsequently executing the remaining model update function, derivative function, and/or zero-crossing function to compute variables contained within the plurality of functions. The rerouted model update, derivative, and zero-crossing functions compute values of variables of direct feedthrough functions using the correct input. The artificial algebraic loop solution includes the alternatives: executing model output function multiple times, or splitting the output method into several sub-output methods, such that a preceding execution provides an updated input variable and a subsequent execution computes the values of variables of direct feedthrough functions that require this input to provide at least one of a desired output and an internal variable; inserting a delay function into the at least one potential artificial algebraic loop and executing the executable process; switching the order of direct feedthrough functions and non-direct feedthrough functions to prevent the occurrence of the artificial algebraic loop, and/or breaking up the inseparable unit of execution into two parts that are each inseparable.

In accordance with further aspects of the present invention, identifying whether the process includes at least one potential artificial algebraic loop includes determining whether there is at least one path of execution in an inseparable unit of execution wherein a non-direct feedthrough element follows a direct feedthrough element prior to calculation of an output. Providing the executable process having a plurality of functions includes providing at least one sub-system containing the at least one artificial algebraic loop. The at least one sub-system can include at least one nonvirtual sub-system, and/or at least one direct-feedthrough sub-system requiring at least one input variable for execution. The artificial algebraic loop solution can include separating a direct feedthrough part from a remainder of the original content to prevent the occurrence of the potential artificial algebraic loop.

In accordance with further aspects of the present invention, the method further includes representing the executable process using a block diagram format; representing the executable process using an equation format; identifying an execution order for the plurality of functions within the artificial algebraic loop; and/or executing the plurality of functions based at least in part on whether each of the plurality of functions contains an update call, a derivative call, and a zero-crossing call.

In accordance with one embodiment of the present invention, a medium holding computer executable steps for carrying out a method of resolving an algebraic loop is provided. The method includes providing an executable process having a plurality of functions; identifying whether the process includes at least one potential artificial algebraic loop; and if at least one potential artificial algebraic loop exists in the process, implementing an artificial algebraic loop solution that modifies a manner by which the plurality of functions forming the artificial algebraic loop execute.

In accordance with one embodiment of the present invention, a system for identifying and resolving an algebraic loop in a process includes an identification mechanism for identifying whether the process includes at least one potential artificial algebraic loop, and an artificial algebraic loop solution for resolving the algebraic loop. The artificial algebraic loop solution modifies a manner by which the plurality of functions forming the artificial algebraic loop execute.

In accordance with aspects of the present invention, the artificial algebraic loop solution includes execution of at least one of a model update function, a derivative function, and a zero-crossing function that is rerouted to compute the output of variables contained within the plurality of functions that belong to the direct feedthrough part and subsequently executing the remainder of the model update function, derivative function, and zero-crossing function, to operate on the now correctly computed output from the plurality of functions that belong to the direct feedthrough portion. The artificial algebraic loop solution can include execution of a model output function twice, such that a first execution provides an updated input variable and a second execution provides at least one of a desired output and an internal variable; insertion of a delay function prior to the at least one potential artificial algebraic loop and execution of the executable process; and/or switching of the order of direct feedthrough functions and non-direct feedthrough functions to prevent the occurrence of the artificial algebraic loop.

In accordance with further aspects of the present invention, the identification mechanism determines whether there is at least one path of execution wherein a non-direct feedthrough element follows a direct feedthrough element prior to calculation of an output. The process can include at least one sub-system containing the at least one artificial algebraic loop. The at least one sub-system can include at least one nonvirtual sub-system, and/or at least one direct-feedthrough sub-system requiring at least one input variable for execution. The artificial algebraic loop solution can further include a separation of a direct feedthrough part from a remainder of the original content to prevent the occurrence of the potential artificial algebraic loop.

In accordance with further aspects of the present invention, the system can further include the executable process represented in a block diagram format, and/or the executable process represented in an equation format. The system can have an execution order for the plurality of functions within the artificial algebraic loop. The execution order can be for executing the plurality of functions based at least in part on whether each of the plurality of functions contains an update call, a derivative call, and a zero-crossing call.

BRIEF DESCRIPTION OF THE DRAWINGS

The present invention will become better understood with reference to the following description and accompanying drawings, wherein:

FIG. 6B depicts a linear sorted list generated from the directed graph of FIG. 6A;

DETAILED DESCRIPTION

Figure 1A:
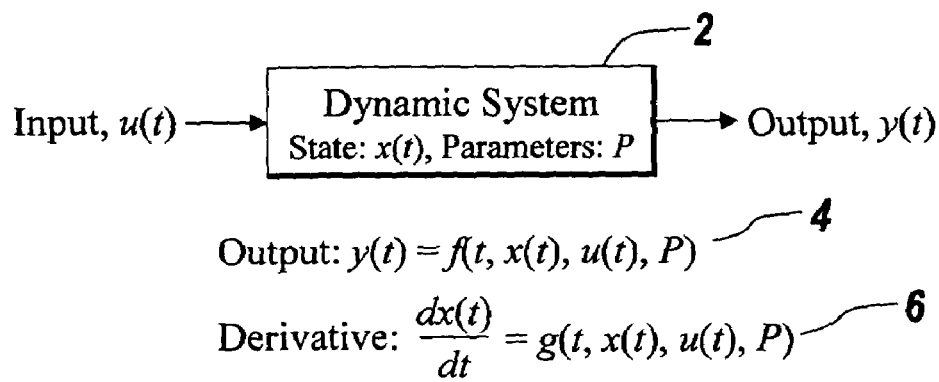
FIG. 1A depicts a dynamic system described with ordinary differential equations (ODE)
Figure 1B:
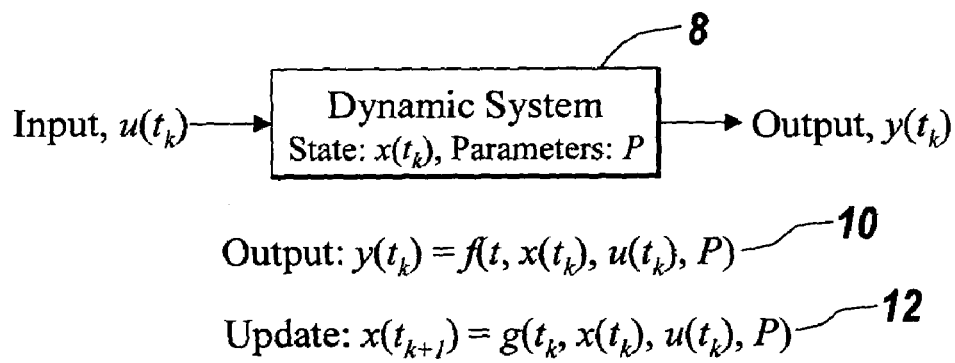
FIG. 1B depicts a dynamic system described with difference equations.
Figure 1C:
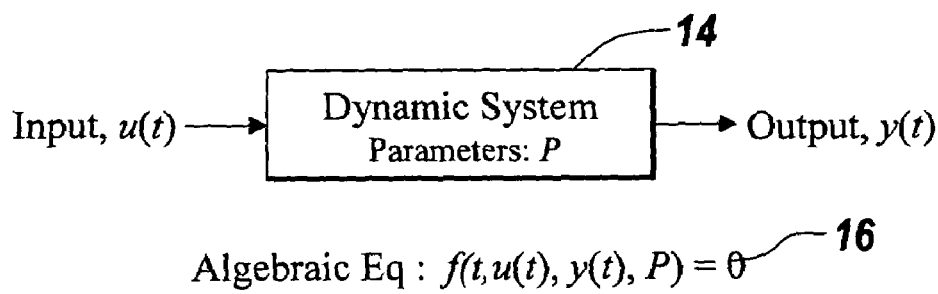
FIG. 1C depicts a dynamic system described with algebraic equations.
Figure 2:
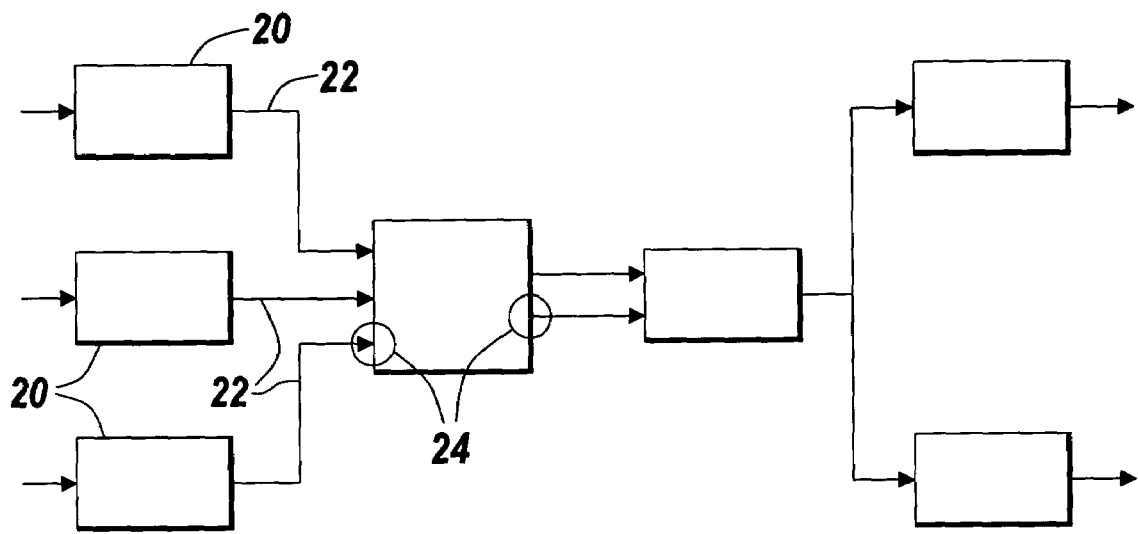
FIG. 2 depicts components of a basic block diagram.
Figure 3:
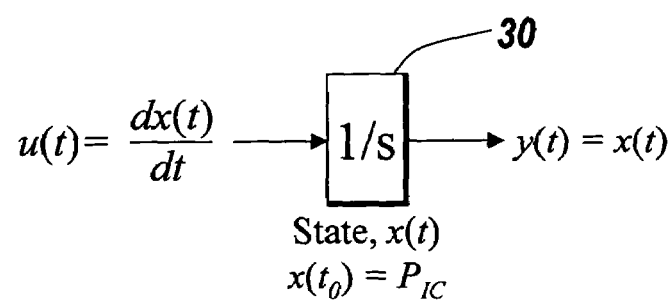
FIG. 3 depicts the desired behavior of an integrator block.
Figure 4:
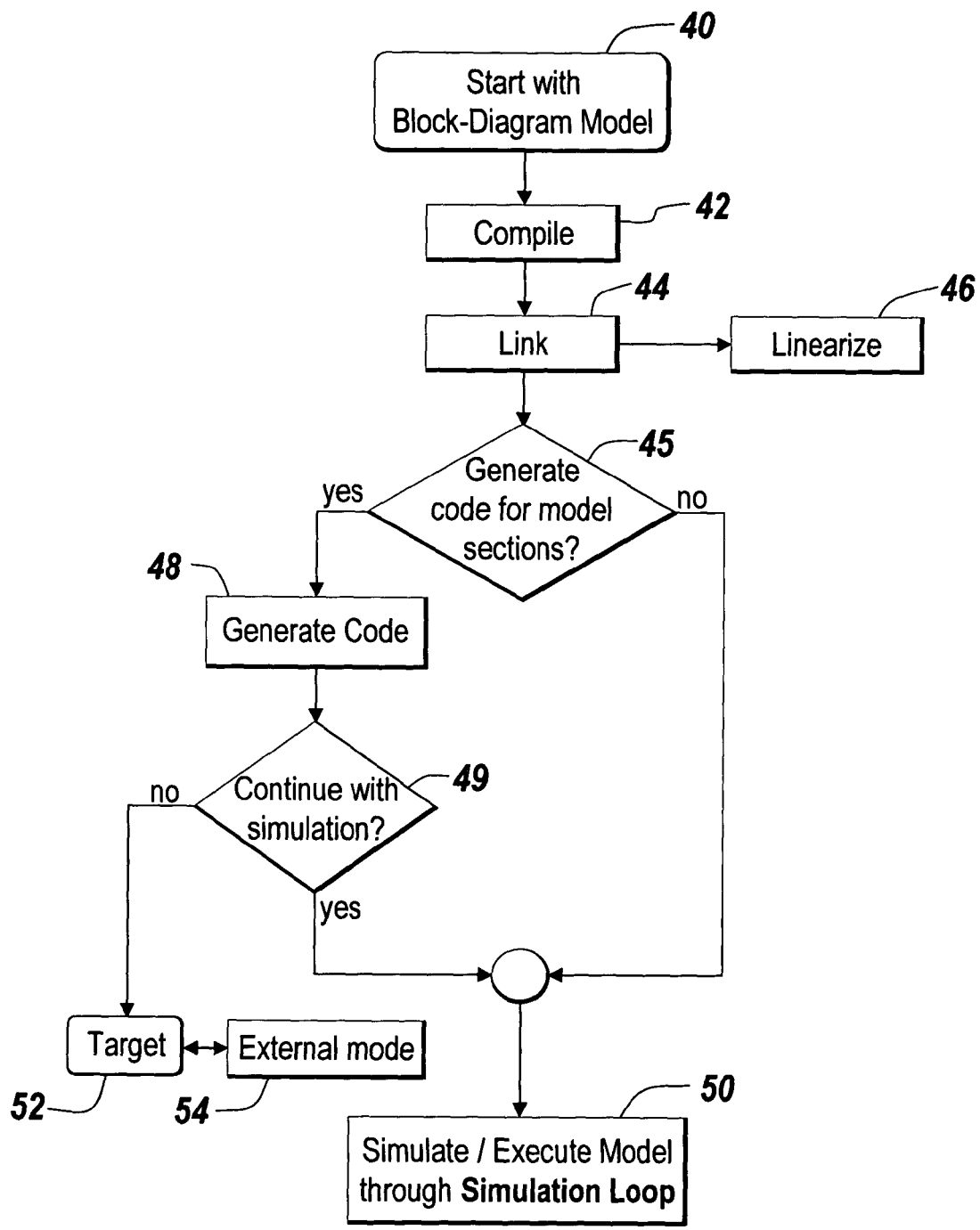
FIG. 4 is a flow chart of the sequence of steps used to perform simulation of the block diagram.
Figure 5:
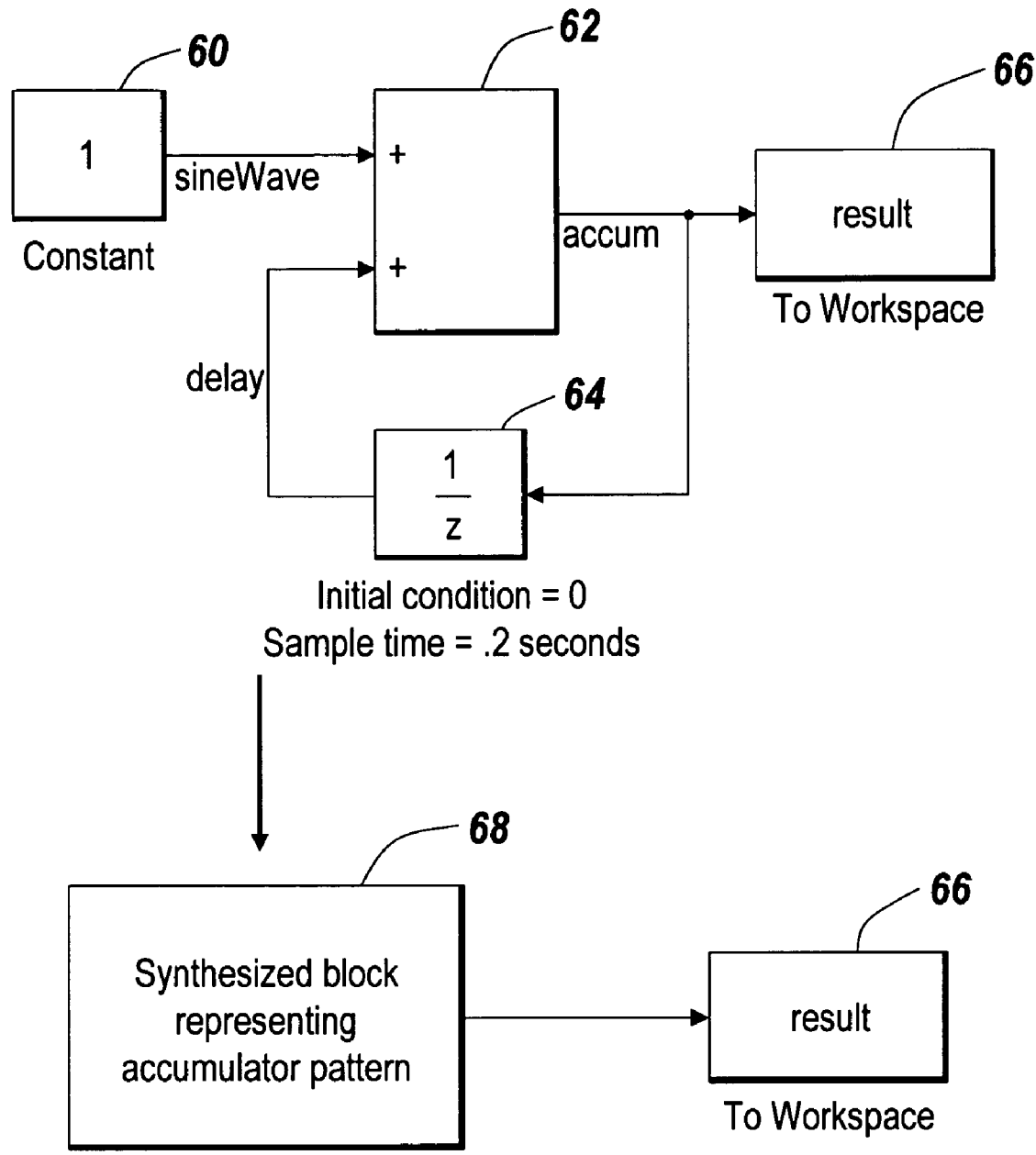
FIG. 5 depicts the replacement of a collection of blocks in a block diagram with an accumulator block.
Figure 6A:
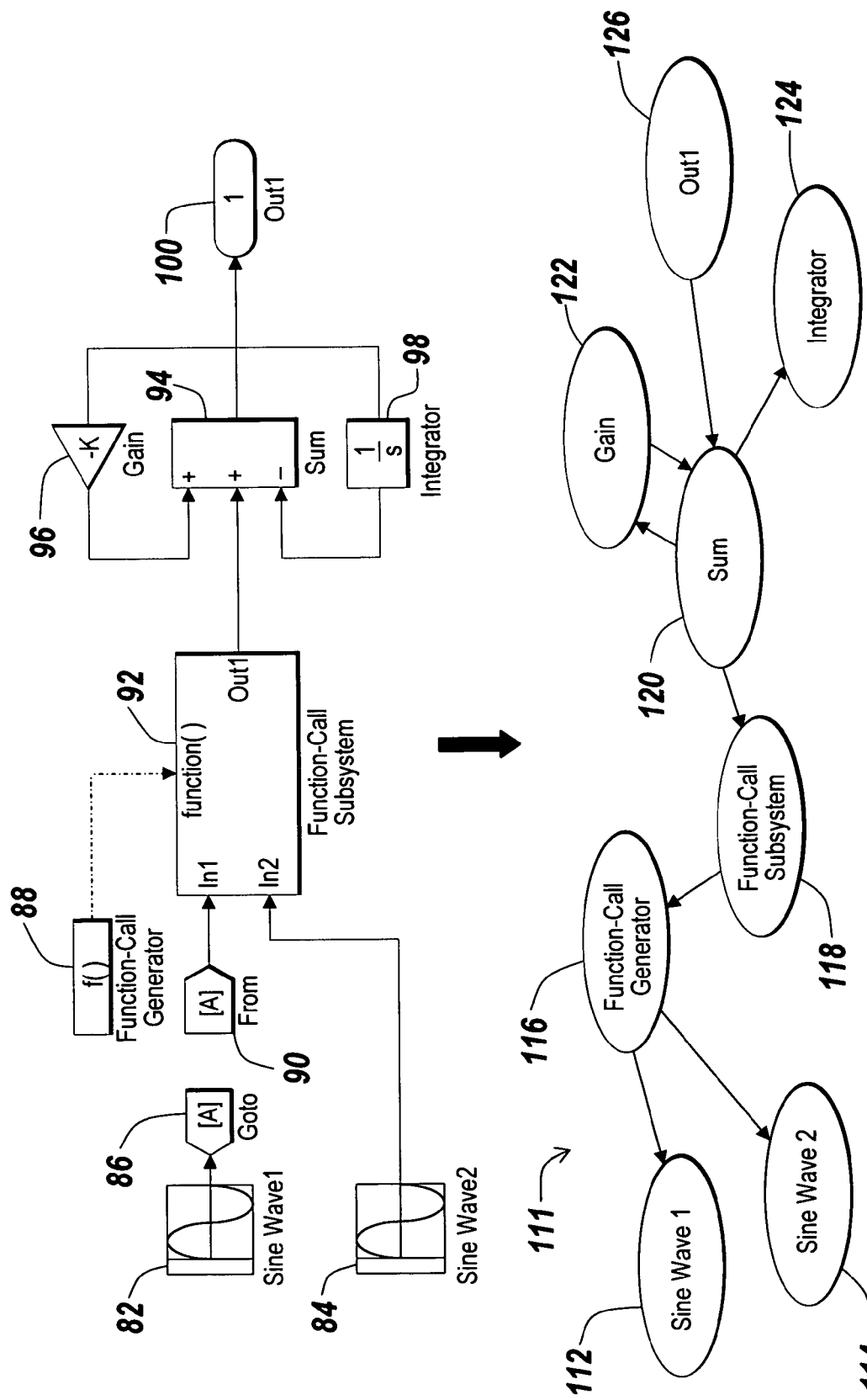
FIG. 6A depicts a block diagram and its associated directed graph.
Figure 7A:
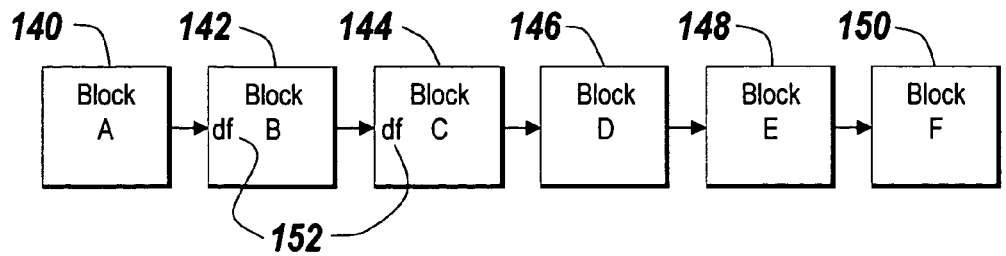
FIG. 7A depicts an abstract example of a block diagram being executed.
Figure 7B:
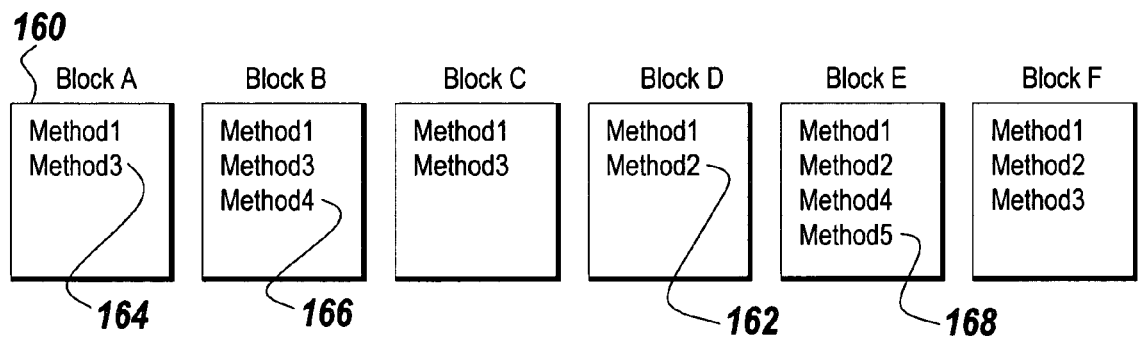
FIG. 7B depicts an abstract view of the execution methods instantiated by the blocks depicted in FIG. 7A.
Figure 7C:
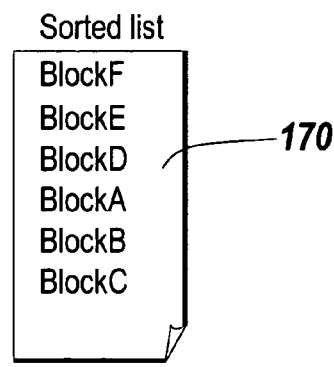
FIG. 7C depicts a sorted list generated from the data dependencies between blocks of FIG. 7A.
Figure 8:
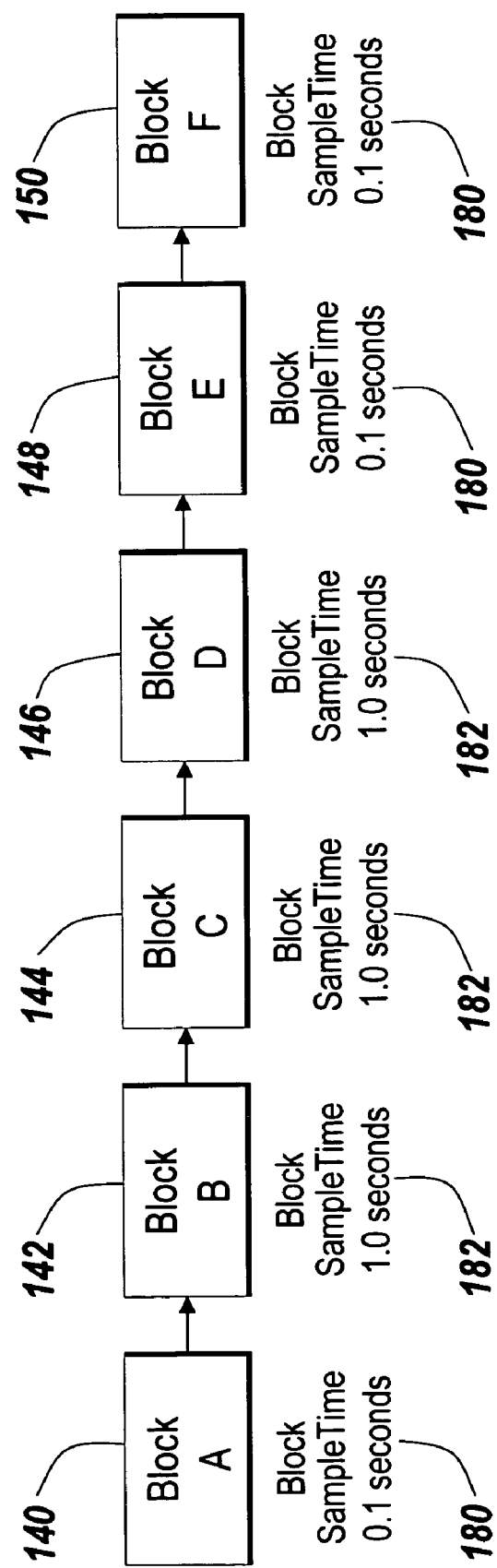
FIG. 8 depicts a multi-rate system.
Figure 9:
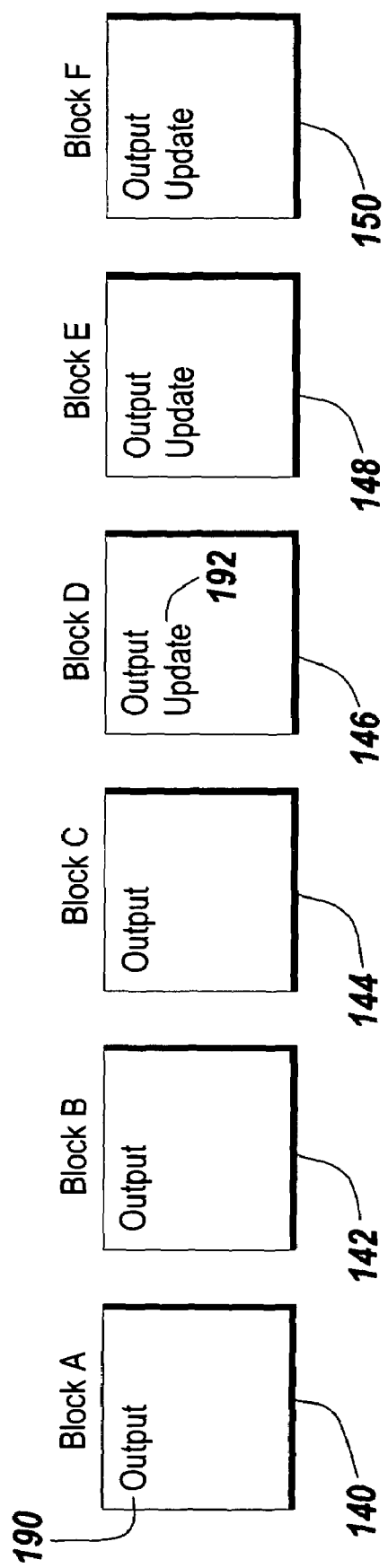
FIG. 9 depicts the block diagram of FIG. 7A and FIG. 8 with associated methods added to the blocks.
Figure 10:
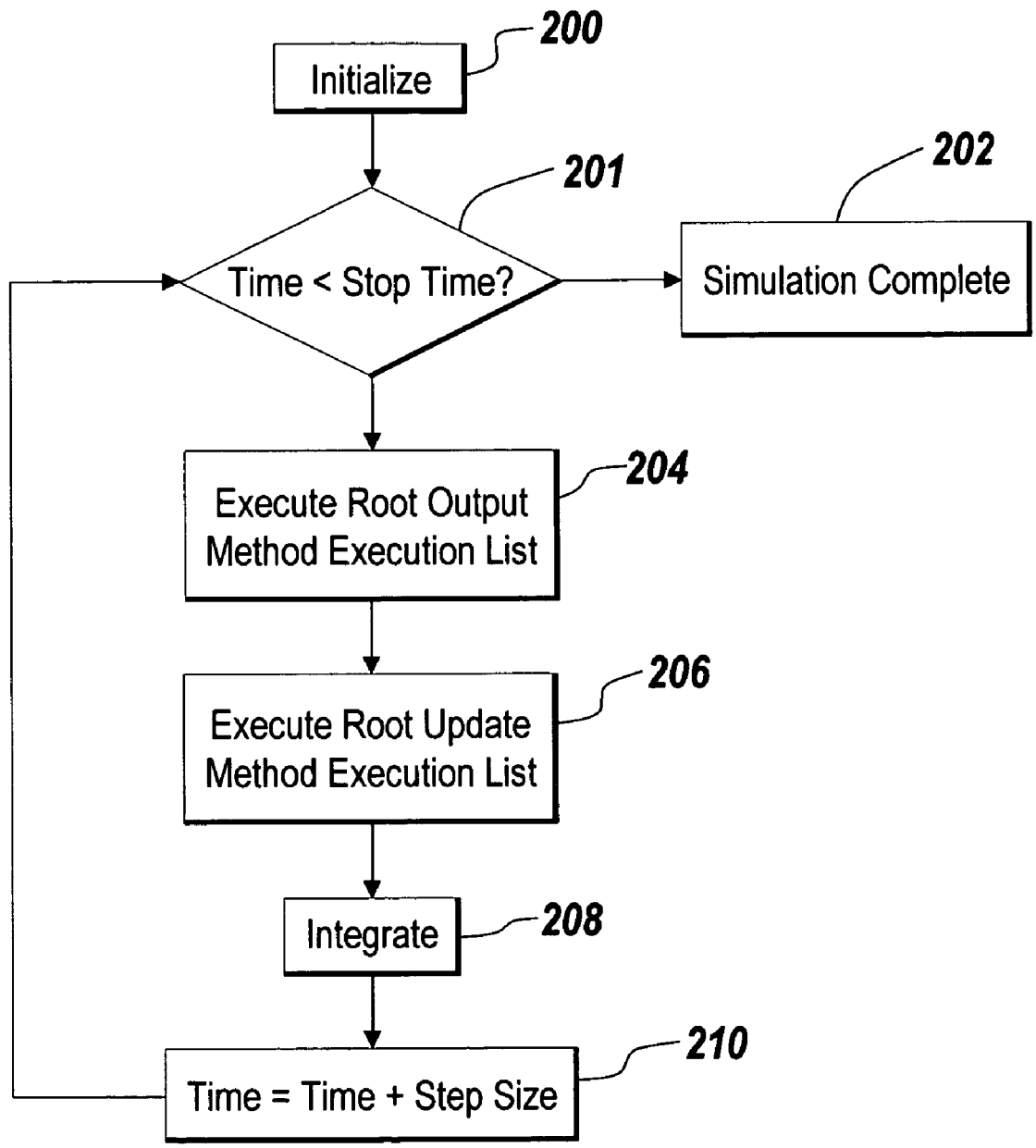
FIG. 10 is a flowchart of the sequence of steps followed by a single-tasking execution loop.
Figure 11A:
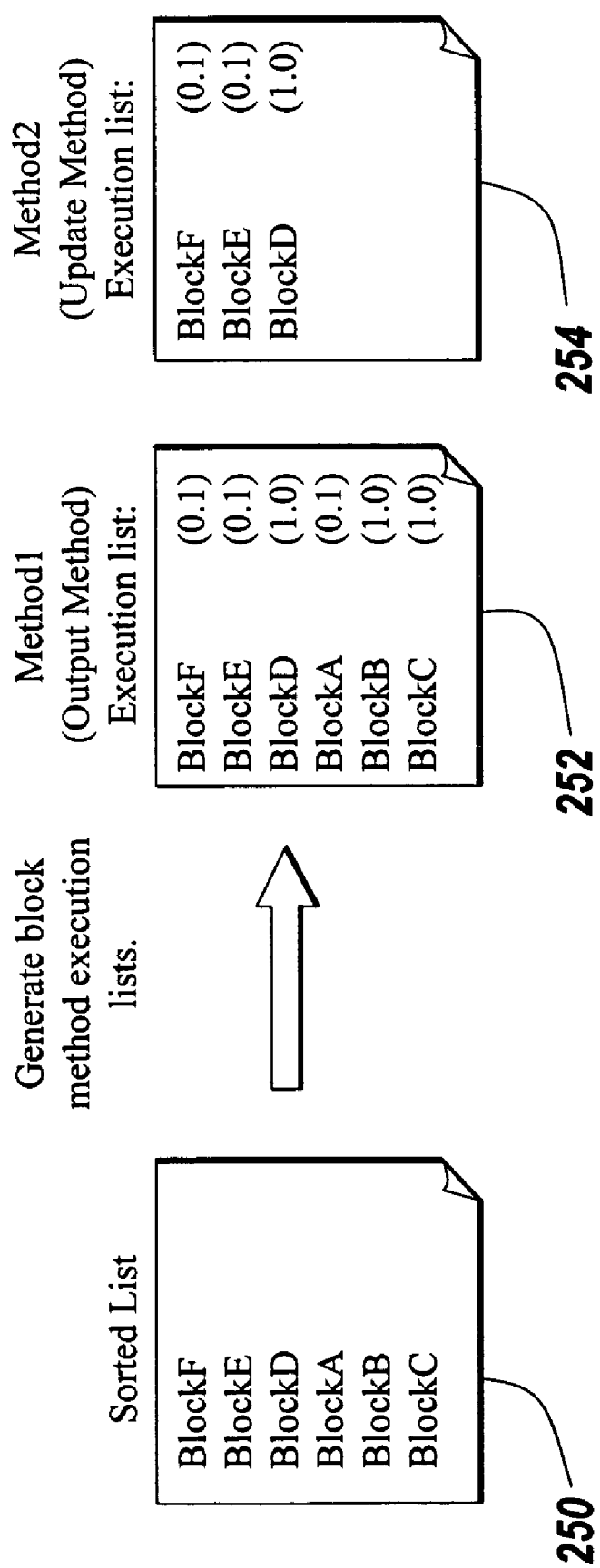
FIG. 11A depicts the creation of execution lists from sorted lists in single task mode.
Figure 11B:
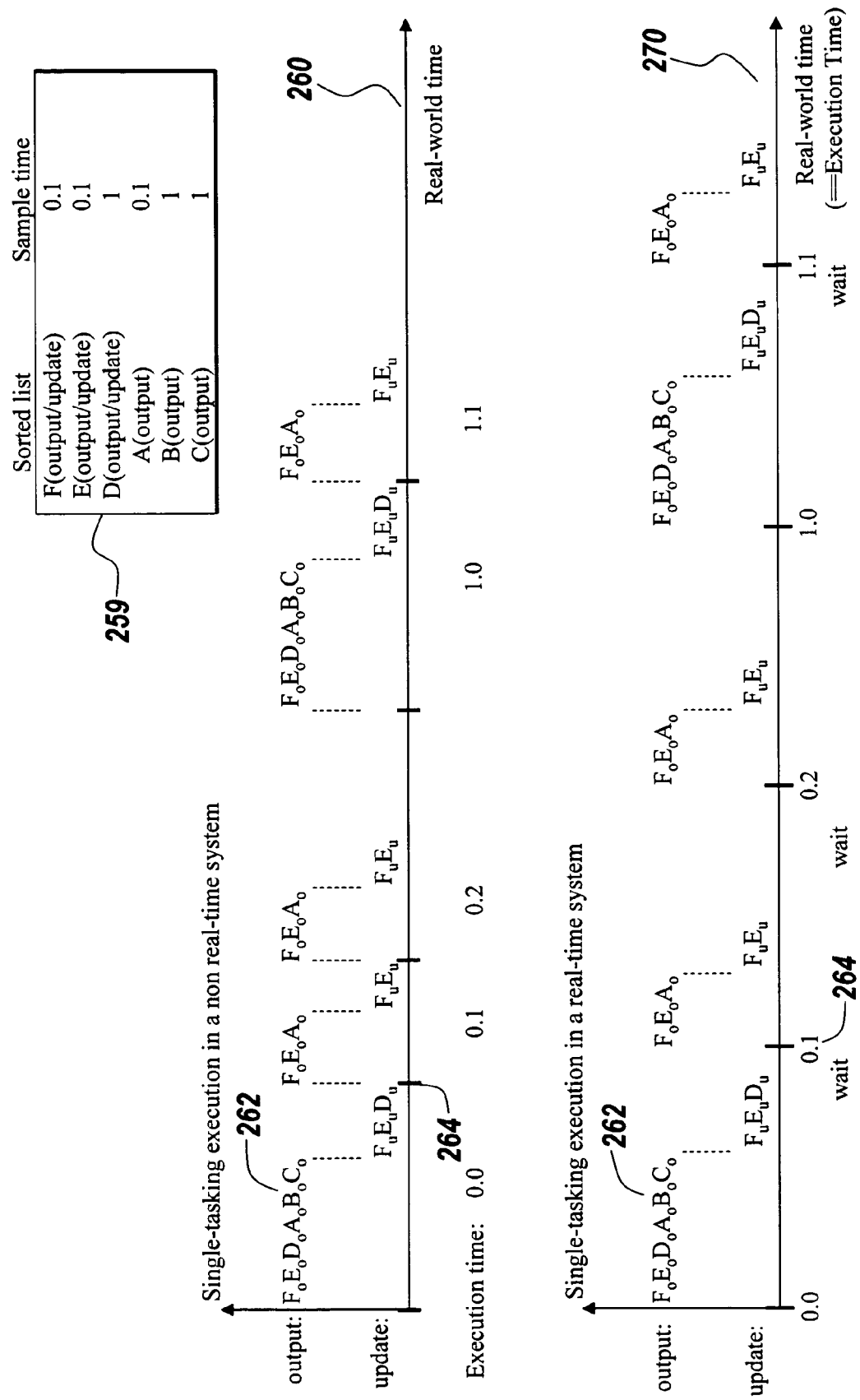
FIG. 11B depicts the execution timing of block diagrams in single task mode in timelines synchronized and non-synchronized with real world time.
Figure 12A:
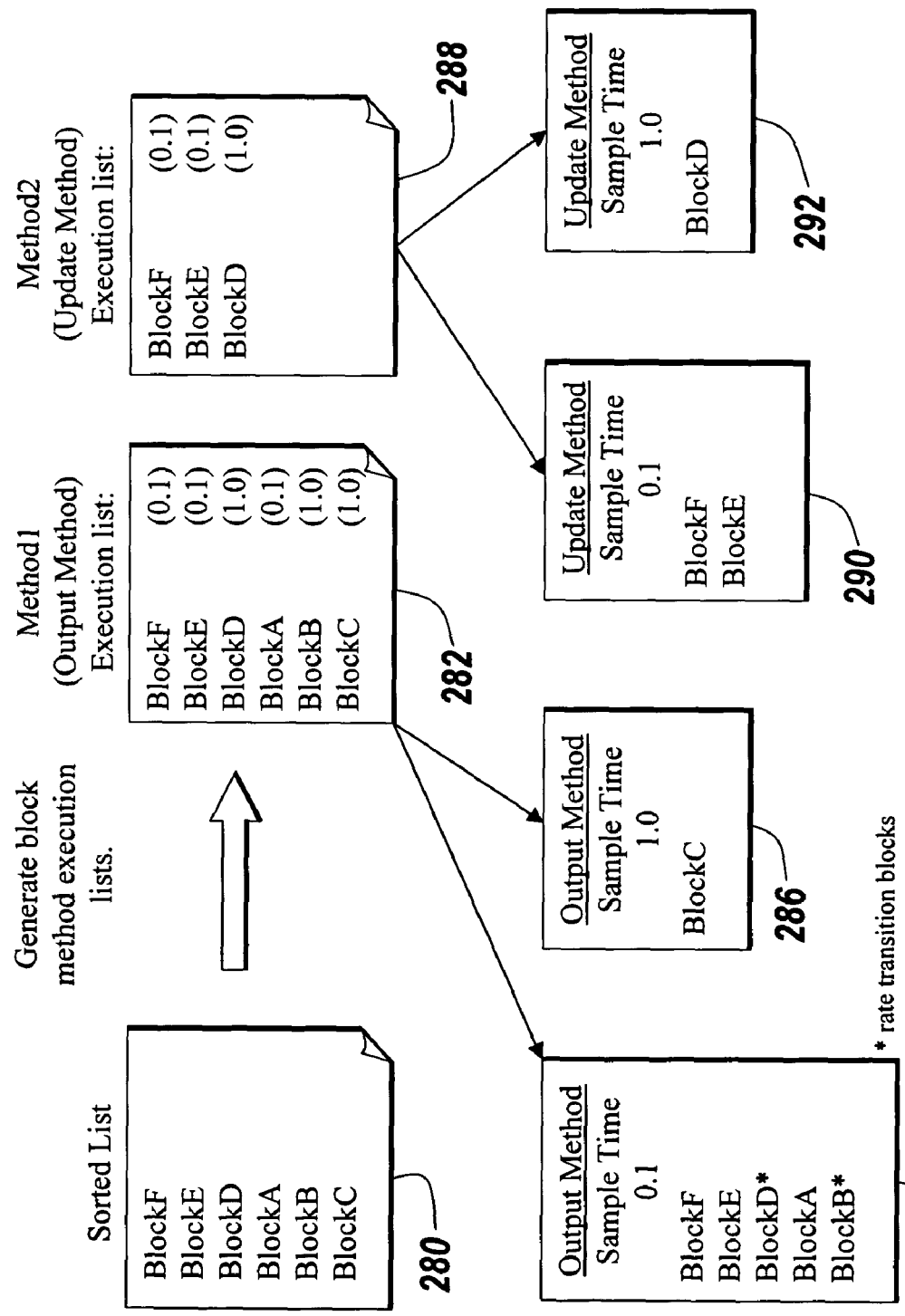
FIG. 12A depicts the creation of execution lists from sorted lists in multi-task mode.
Figure 12B:
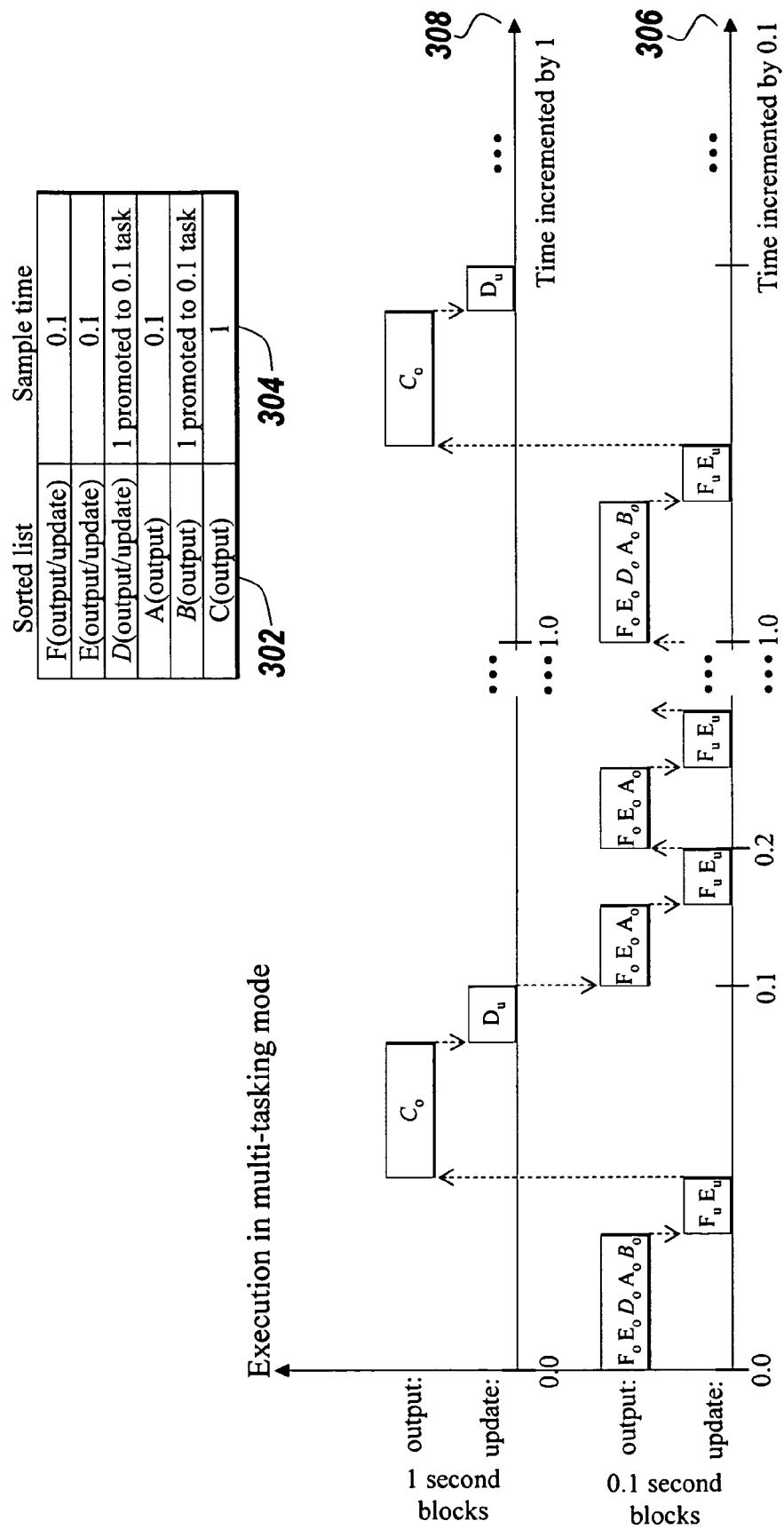
FIG. 12B depicts the execution timing of block diagrams in multi-task mode.
Figure 13:
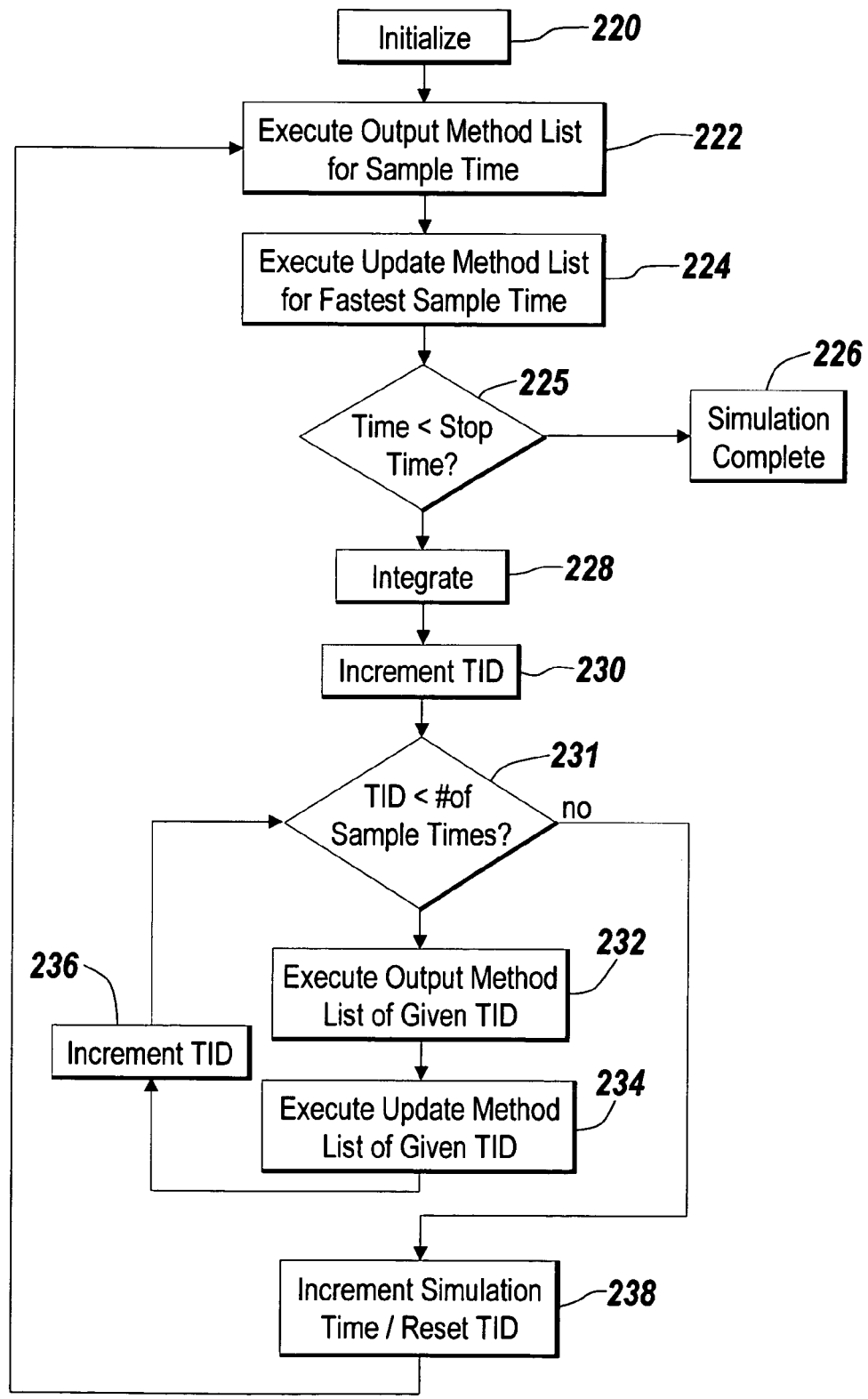
FIG. 13 is a flowchart of the overall sequence of steps taken by Simulink® in multi-task mode.
Figure 14:
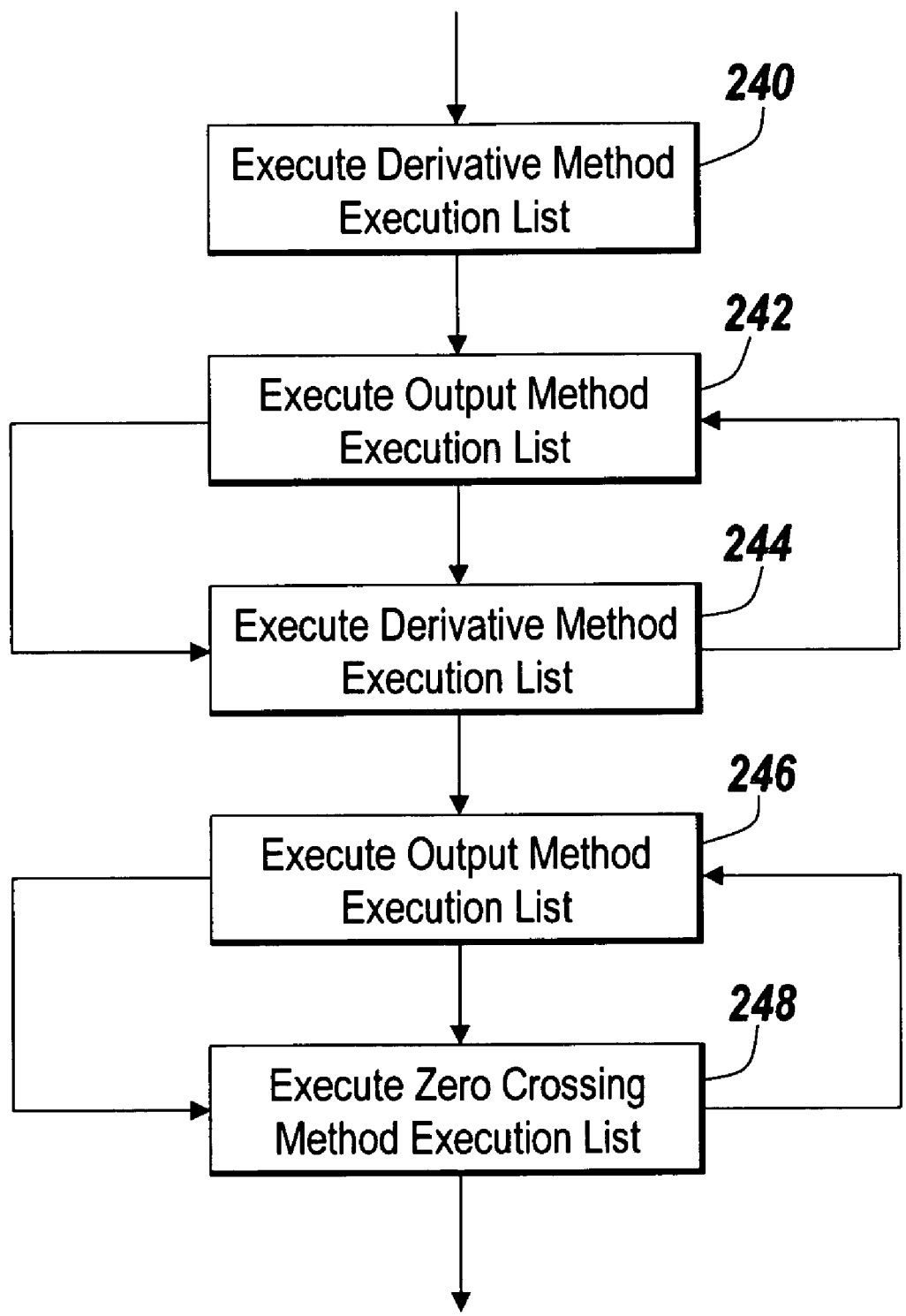
FIG. 14 is a flowchart of the sequence of steps followed by a variable-step solver.
Figure 15:
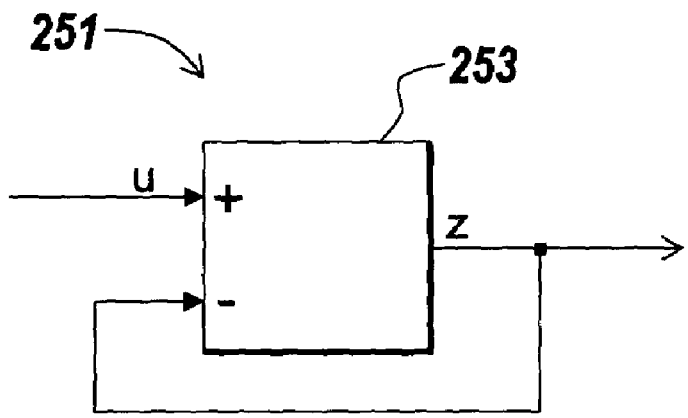
FIG. 15 is a diagrammatic illustration of an algebraic loop, as is known in the art.
Figure 16:
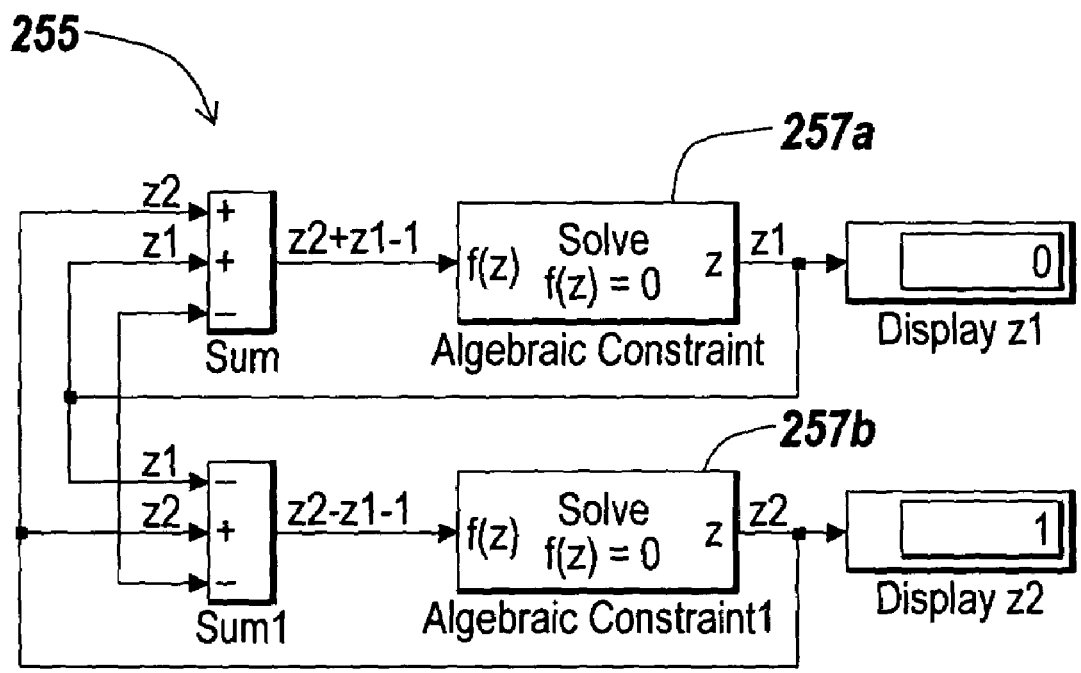
FIG. 16 is a diagrammatic illustration of a conventional Algebraic Constraint block for resolving artificial algebraic loops, as is known in the art.

An illustrative embodiment of the present invention relates to an automated solution for addressing artificial algebraic loops in a block diagram or text or equation based execution, simulation, or modeling system. The automated solution involves scanning a model to identify each occurrence of a potential artificial algebraic loop. Once each potential artificial algebraic loop is identified, the present invention partitions the potential artificial algebraic loop in a regular part and a direct feedthrough part, the output of the latter is computed in the update phase of the simulation to obtain a correct output of all blocks involved. More specifically, when the blocks of the model are tasked with calculating an output, the present invention disregards the blocks in the direct feedthrough portion. Then, when tasked to update the state, the blocks in the direct feedthrough part first compute their output to obtain correct output values of all blocks in the model.

The phrase "potential artificial algebraic loop" refers to a situation that is context independent. In other words, the potential artificial algebraic loop represents a situation wherein there is a potential or possibility that given the occurrence of certain events or execution orders, an artificial algebraic loop will exist, having an inseparable unit of execution. An actual artificial algebraic loop can only emerge when the context is available, such as if the output of an inseparable unit of execution is related to its input through a direct feedthrough path.

As utilized herein, the term "function" encompasses the functionality of any combination of elemental computations, including blocks of a block diagram, equations, state variables, or any other element having functional attributes as understood by one of ordinary skill in the art.

The analysis of the present invention, studies each inseparable unit of execution individually and without knowledge of how the unit of execution is or will be utilized, i.e, the context, and determines whether an artificial algebraic loop may arise. If there is a potential for an artificial algebraic loop to occur, the artificial algebraic loop solution can be employed.

There may be reasons to refrain from applying the artificial algebraic loop solution, however, when the potential exists after the unit of inseparable execution connects with the rest of the system. Therefore, a decision stage is required before the solution is applied which, in its basic form, can be a flag set by the user. This decision criterion can be made as sophisticated as desired, e.g., by incorporating context knowledge. In such an instance, the artificial algebraic loop solution is only applied when a potential artificial algebraic loop is found if analysis of the context shows an artificial algebraic loop will, in fact, emerge. This, of course, requires knowledge of the context of a unit of inseparable execution, which, in general, may not be available. It should be noted that the present invention anticipates such an arrangement, and makes the assumption that such an analysis is either non-existent, or has resulted in the determination that there is in fact a potential artificial algebraic loop that must be resolved.

FIGS. 17 through 23, wherein like parts are designated by like reference numerals throughout, illustrate example embodiments of an artificial algebraic loop resolver according to the present invention. Although the present invention will be described with reference to the example embodiments illustrated in the figures, it should be understood that many alternative forms can embody the present invention. One of ordinary skill in the art will additionally appreciate different ways to alter the parameters of the embodiments disclosed in a manner still in keeping with the spirit and scope of the present invention.

As stated previously, the present invention is applicable to both text or equation based model execution and block diagram or otherwise graphical language based model execution. However, for purposes of clarity, the present invention will be described with reference to a block diagram embodiment. One of ordinary skill in the art will appreciate, however, that a block of a block diagram is simply a representation of one or more variables, inputs, outputs, equations, and the like that can be expressed in text or equation form. Thus, any reference herein to a "block" likewise applies to a textual equivalent, and thus is not limiting the present invention to operation only with block diagram formats.

As mentioned previously, block diagrams are a set of graphical connections between blocks to model the above-described dynamic systems. The individual blocks in a block diagram represent mathematical operations and output a result. Some Simulink® blocks have input ports with direct feedthrough. A block input port has direct feedthrough if the block's functionality that requires input at time, t, to be known when the output at time, t, is computed. Block input ports with direct feedthrough, in some instances, are identified by the simulation program. For example, Simulink® flags each block input port as either having or not having direct feedthrough. Some examples of blocks with direct feedthrough input ports include the Math Function block, the Gain block, the Integrator block's initial condition ports, the Product block, the State-Space block when there is a nonzero D matrix, the Sum block, the Transfer Fcn block when the numerator and denominator are of the same order, and the Zero-Pole block when there are as many zeros as poles. These blocks and functions, and equivalent or additional blocks and functions not specifically mentioned herein, can become part of a set of inseparable computations to create artificial algebraic loops that are resolvable by the method of the present invention.

Figure 17:
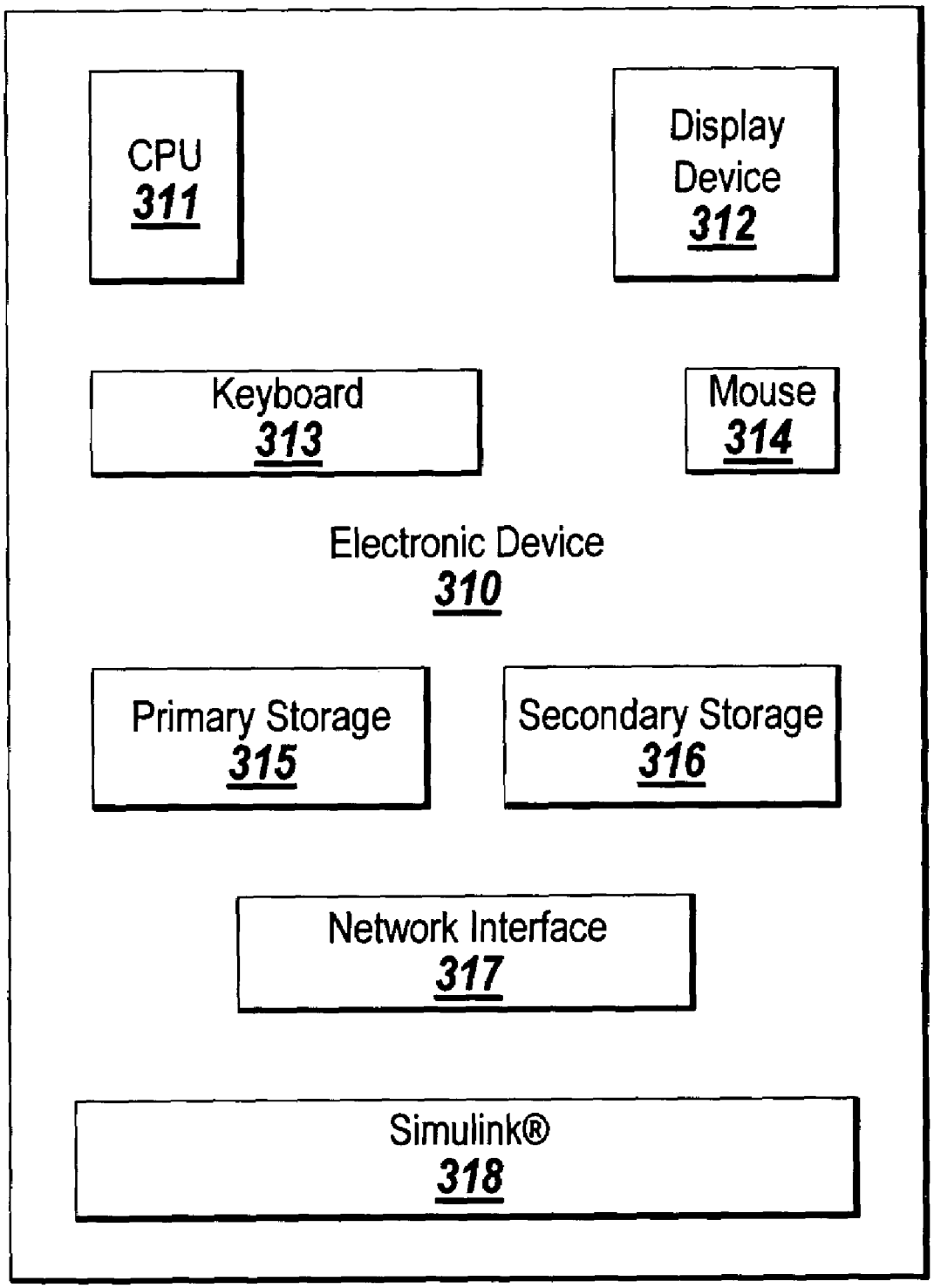
FIG. 17 is a diagrammatic illustration of an electronic device for executing the method of the present invention.

FIG. 17 illustrates one example embodiment of an electronic device 310 suitable for practicing the illustrative embodiments of the present invention. The electronic device 310 is representative of a number of different technologies, such as personal computers (PCs), laptop computers, workstations, personal digital assistants (PDAs), Internet appliances, cellular telephones, and the like. In the illustrated embodiment, the electronic device 310 includes a central processing unit (CPU) 311 and a display device 312. The display device 312 enables the electronic device 310 to communicate directly with a user through a visual display. The electronic device 310 further includes a keyboard 313 and a mouse 314. Other potential input devices not depicted include a stylus, trackball, joystick, touch pad, touch screen, and the like. The electronic device 310 includes primary storage 315 and secondary storage 316 for storing data and instructions. The storage devices 315 and 316 can include such technologies as a floppy drive, hard drive, tape drive, optical drive, read only memory (ROM), random access memory (RAM), and the like. Applications such as browsers, JAVA virtual machines, and other utilities and applications can be resident on one or both of the storage devices 315 and 316. The electronic device 310 can also include a network interface 317 for communicating with one or more electronic devices external to the electronic device 310 depicted. A modem (not shown) is one form of establishing a connection with an external electronic device or network. The CPU 311 has either internally, or externally, attached thereto one or more of the aforementioned components. In addition to applications previously mentioned, modeling applications, such as Simulink® 318, can be installed and operated on the electronic device 310.

It should be noted that the electronic device 310 is merely representative of a structure for implementing the present invention. However, one of ordinary skill in the art will appreciate that the present invention is not limited to implementation on only the described device 310. Other implementations can be utilized, including an implementation based partially or entirely in embedded code, where no user inputs or display devices are necessary. Rather, a processor can communicate directly with another processor or other device.

Figure 18:
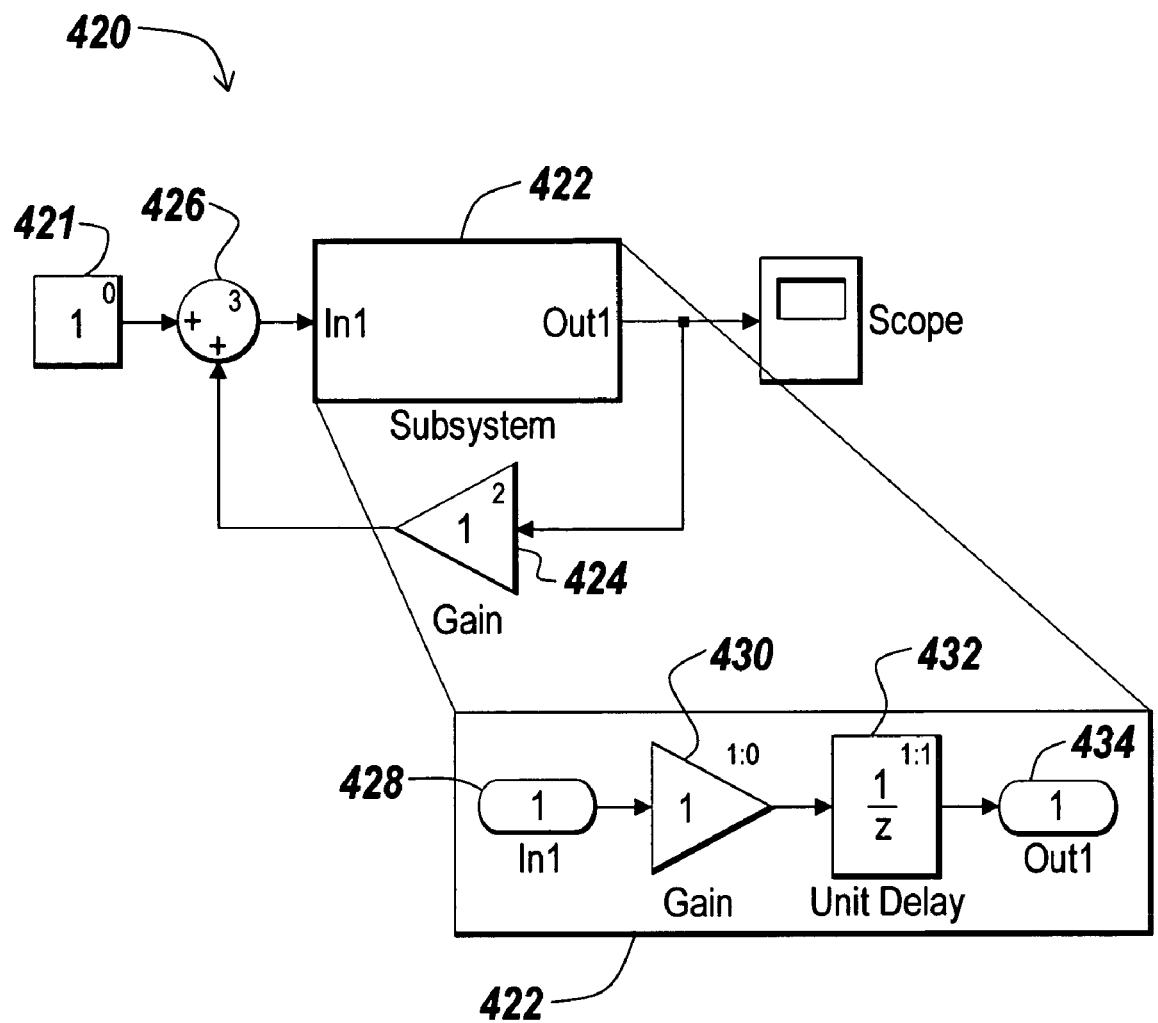
FIG. 18 is a diagrammatic illustration of an artificial algebraic loop structured as a sub-system, according to one aspect of the present invention.

Turning now to a description of the present invention, FIG. 18 is a diagrammatic illustration of an artificial algebraic loop 420. The example artificial algebraic loop 420 includes an Atomic Sub-system 422, a Gain 424, and a Sum 426. The Atomic Sub-system 422 further includes an Input 428, supplied to a Sub-system Gain 430, which feeds to a Unit Delay 432, and ultimately to an Output 434. It should be noted that the Unit Delay 432, or other delay functions as utilized herein, can include time delays and memory function delays, as understood by one of ordinary skill in the art. Initially, a constant 421 feeds the Sum 426.

As previously stated, artificial algebraic loops result from a grouping of equations. Graphically, block diagram model simulators, such as Simulink®, show groupings that are part of a potential artificial algebraic loop as nonvirtual sub-systems, one of which is the Atomic Sub-system 422.

As shown, the Atomic Sub-system 422 contains the Gain 430 computation and the Unit Delay 432 computation. The combination of the Gain 430 and the Unit Delay 432 as shown creates the problem of the artificial algebraic loop because there is a dependence of the system input on the system's own output. More specifically, because the Sub-system 422 is an inseparable unit, the output of the Gain 430 and the output of the Unit Delay 432 have to be computed immediately following one another. For the Gain 430 to compute the correct value, the input to the Gain 430 is required. Thus, when the output of Sub-system 422 is to be computed, the output of Unit Delay 432 has to be computed as well as the output of Gain 430, and, therefore, the input has to be available as well.

Figure 19A:
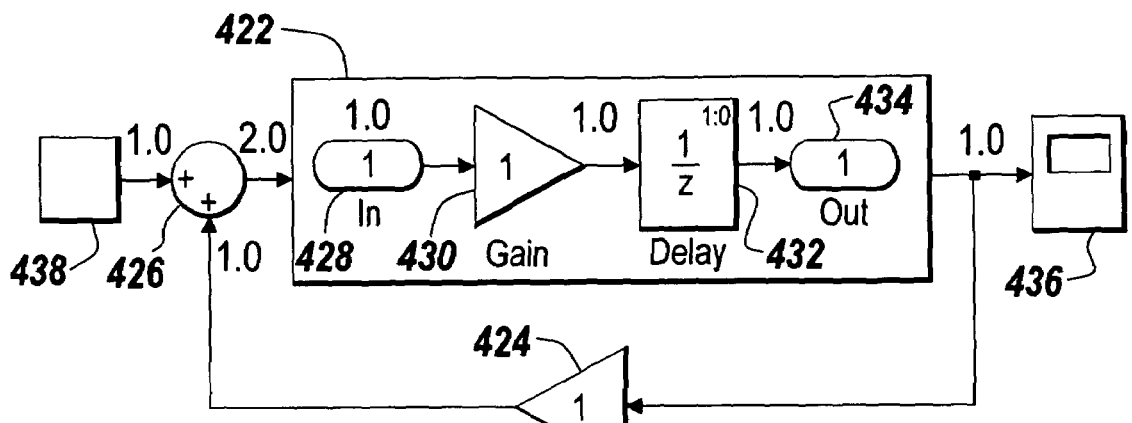
FIGS. 19A, 19B, and 19C are schematic illustrations showing execution stages of a model simulation implementing the artificial algebraic loop solution, according to one aspect of the present invention.
Figure 19B:
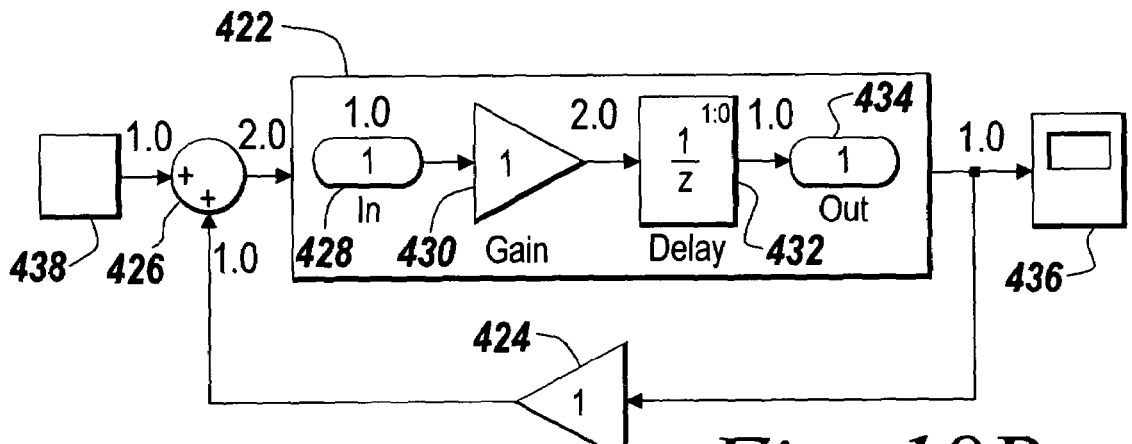
Figure 19C:
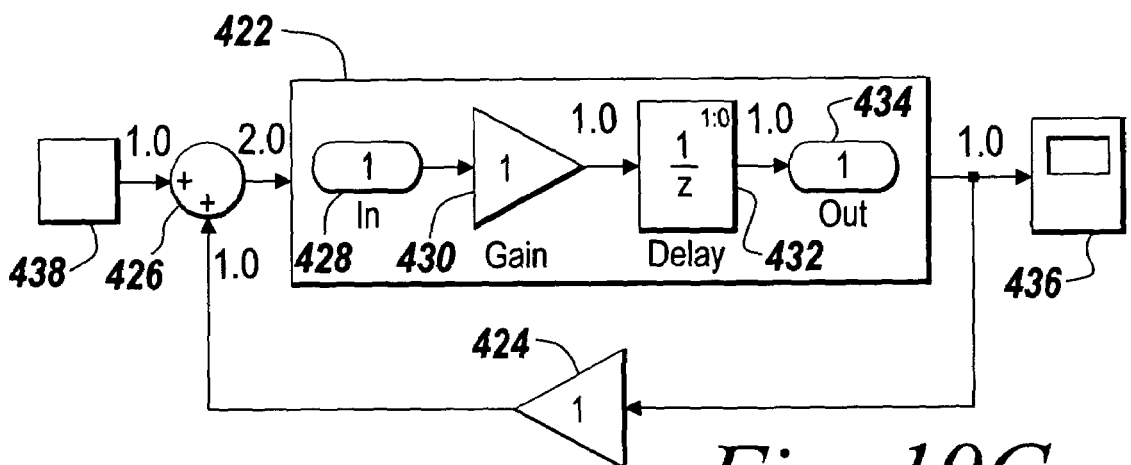

FIGS. 19A, 19B, and 19C are diagrammatic illustrations of the Atomic Sub-system 422 of FIG. 18 that illustrate the sequence of calculations at one time step highlighting the existence of an artificial algebraic loop, and the corresponding resolution of the artificial algebraic loop provided by the present invention.

At the initial stage, the values of the state block Unit Delay 432 and a source block Input 438 are made available. The result is shown in the FIG. 19A. First, the value (a value of 1.0) of the source block Input 438 is computed. This value (1.0) makes one of the inputs to the Sum 426 known. Because at this point the other input to the Sum 426 in the form of the output from the Gain 424 has not been calculated.

The output of the atomic Sub-system 422, and the output at output Block 436, is computed next. The Unit Delay 432 element is requested to produce its output (a value of 1.0), producing the value of the Output 434. This value is processed by the Gain 424 to compute the other input of the Sum 426. At this time, the Sum 426 has both input values (each value being 1.0). The Sum 426 calculates its output, a value of 2.0.

At this point, all blocks at the top level (Constant 421, Sub-system 422, Gain 424, and Sum 426) have been requested to compute their outputs. However, the value of the Gain 430 in the Sub-system 422 has either not been computed correctly, or not been computed at all. The Gain 430 currently indicates a value of 1.0. Thus, when the state of Unit Delay 432 is now updated, the incorrect value (1.0)

is used. The state of the blocks as shown in FIG. 19A, thus, illustrates the result of the existence of the artificial algebraic loop 420.

The artificial algebraic loop resolver of the present invention resolves the problem of the incorrect input to the Unit Delay 432 by first computing the output of the Gain 430 before updating Unit Delay 432. FIG. 19B shows how the update to the Unit Delay 432 now results in the value 2.0 being input to the Unit Delay 432. When the Unit Delay 432 is called to update, the Unit Delay 432 now uses the correct input value of 2.0. FIG. 19C shows the Unit Delay 432 receiving the value of 2.0 as an input and using that value to complete the delay function, as indicated by the "2.0" shown within the box outline of the Unit Delay 432.

Figure 20:
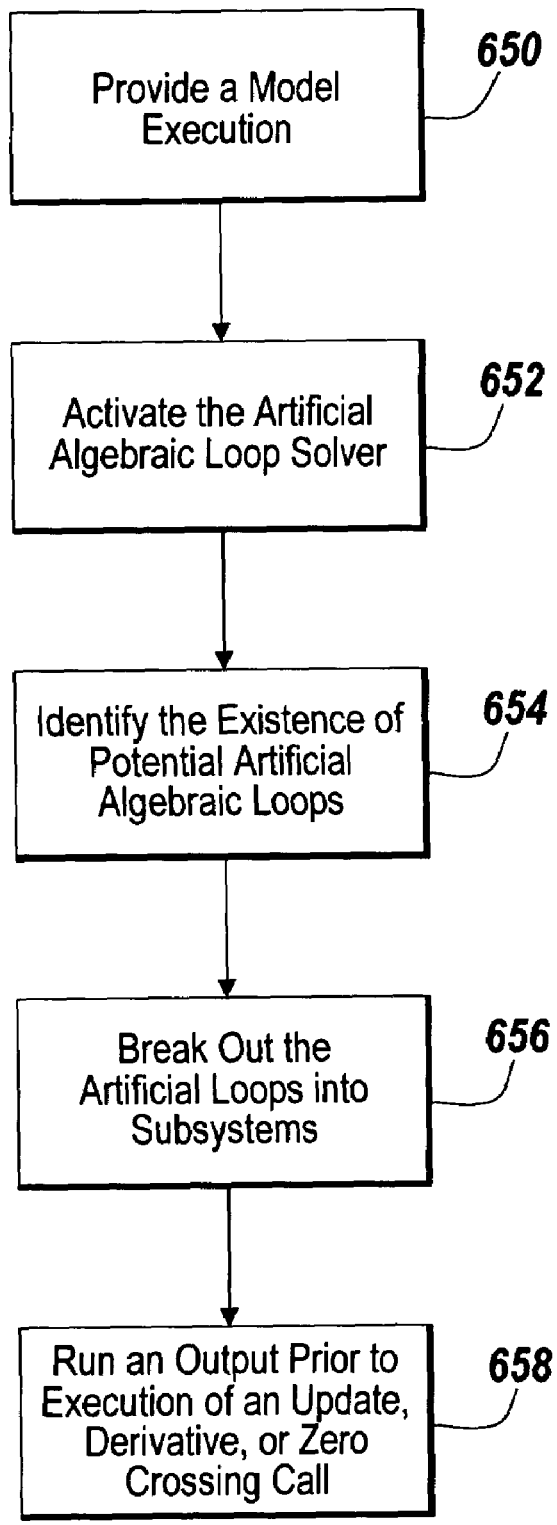
FIG. 20 is a flow chart depicting a method of resolving an artificial algebraic loop, according to one aspect of the present invention.

FIG. 20 illustrates a flowchart summarizing one embodiment of the present invention that leads to the result as depicted in FIGS. 19A through 19C. A user first creates or obtains a model execution in a text or equation based, or block diagram, or other graphical language, based format (step 650). In refining the model simulation, the user can take advantage of the artificial algebraic loop resolver. More specifically, the user activates the artificial algebraic loop resolver (step 652).

The artificial algebraic loop resolver identifies the existence of potential artificial algebraic loops (step 654) by tracing blocks with direct feedthrough in inseparable execution units (i.e., nonvirtual subsystem) from the input to the output. If along the processing path, a non-direct feedthrough block is encountered, the path up to the non-direct feedthrough block is considered to be part of a potential artificial algebraic loop and identified as part of the direct feedthrough portion of the inseparable execution unit. If a trace of the direct feedthrough blocks reaches an output, though, then the inseparable unit has a direct feedthrough port. In this instance, the algebraic loop is not artificial.

Once all of the potential artificial algebraic loops are found, they are each broken out into synthesized sub-systems (step 656). The synthesized sub-systems are generated based on the input port that connects with the blocks. If they can be traced to multiple input ports (by both forward and backward propagation), they are moved into the sub-system that belongs to the input port with lowest index.

It should be noted that the above steps, and the invention in general, can be implemented as an iterative process. The user, or an algorithm or processor, can repeat the analysis of a system, seeking out and resolving potential artificial algebraic loops with each iteration to arrive at a more efficient simulation.

The synthesized sub-systems register the need for invocation during the update, derivative, or zero-crossing stages of an execution. When triggered, the synthesized sub-systems compute the output of the contained blocks. Because these sub-systems are moved to the top of the update call list, and therefore enforced to be called before the rest of the blocks in the inseparable unit, the output of the direct feedthrough portion is computed before the update of state elements, such as the Unit Delay, are executed (step 658). The artificial algebraic loop resolver thus operates to compute the output of the inseparable direct feedthrough portion prior to any update of the model simulation.

The artificial algebraic loop resolver of the present invention is not limited to identifying artificial algebraic loops, partitioning them off into sub-systems, and requiring an update call prior to completing an output call. In addition, the artificial algebraic loop resolver can be modified to provide alternate solutions for artificial algebraic loops. Some example alternate solutions are provided below.

Figure 21A:
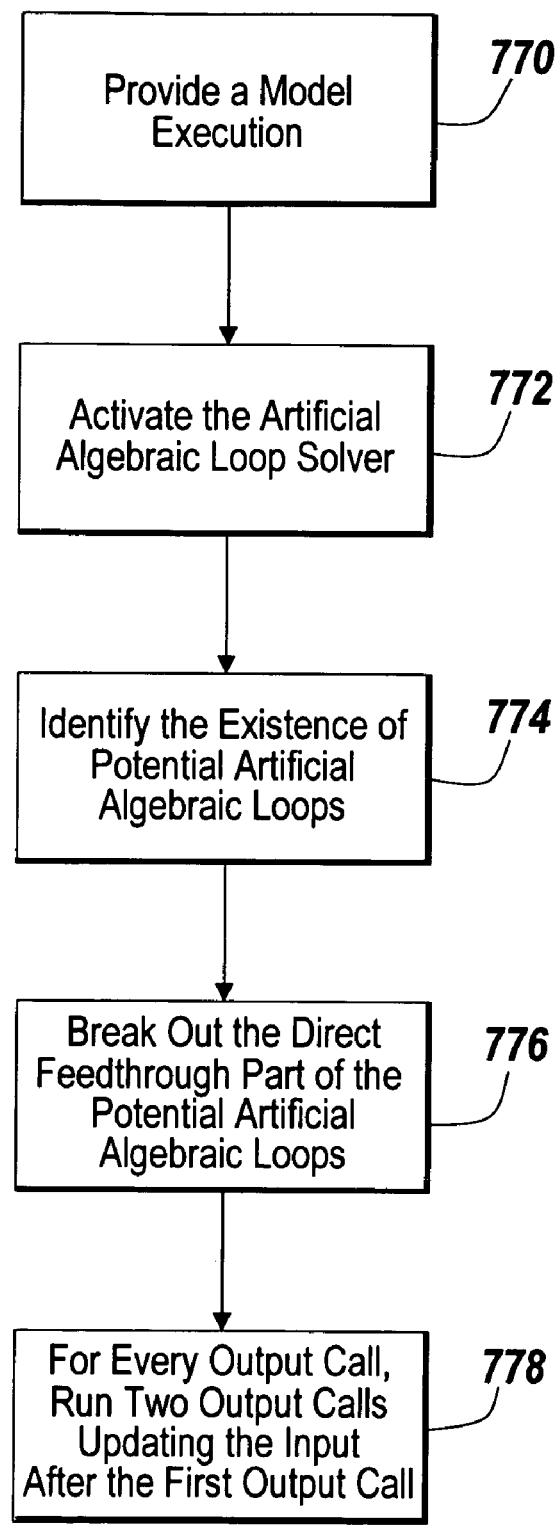
FIG. 21A is a flow chart depicting another method of resolving an artificial algebraic loop, according to one aspect of the present invention.

FIG. 21A illustrates the implementation of another embodiment of the artificial algebraic loop resolver of the present invention. A user first creates or obtains a model execution in a text or equation based or block diagram based format (step 770). In refining the model execution, the user can again take advantage of the artificial algebraic loop resolver. The artificial algebraic loop resolver is activated, either by the user or automatically (step 772). The artificial algebraic loop resolver identifies the existence of potential artificial algebraic loops by identifying input ports with direct feedthrough that could be driven by the output of the same block, either directly, or by a feedback path through other blocks with direct feedthrough (step 774).

Here, the algebraic loop analysis differentiates between ports. Instead of setting a generic direct feedthrough flag for each input port, a record is made of which output ports have a direct feedthrough path from each of the input ports. This allows inclusion of artificial algebraic loops with actual direct feedthrough within the set of inseparable computations (step 776). So, the artificial algebraic loop is not required to have a non direct feedthrough block as part of the loop. The artificiality of the artificial algebraic loop stems from the routing of input signals to particular output ports in a set of blocks with inseparable execution.

Figure 21B:
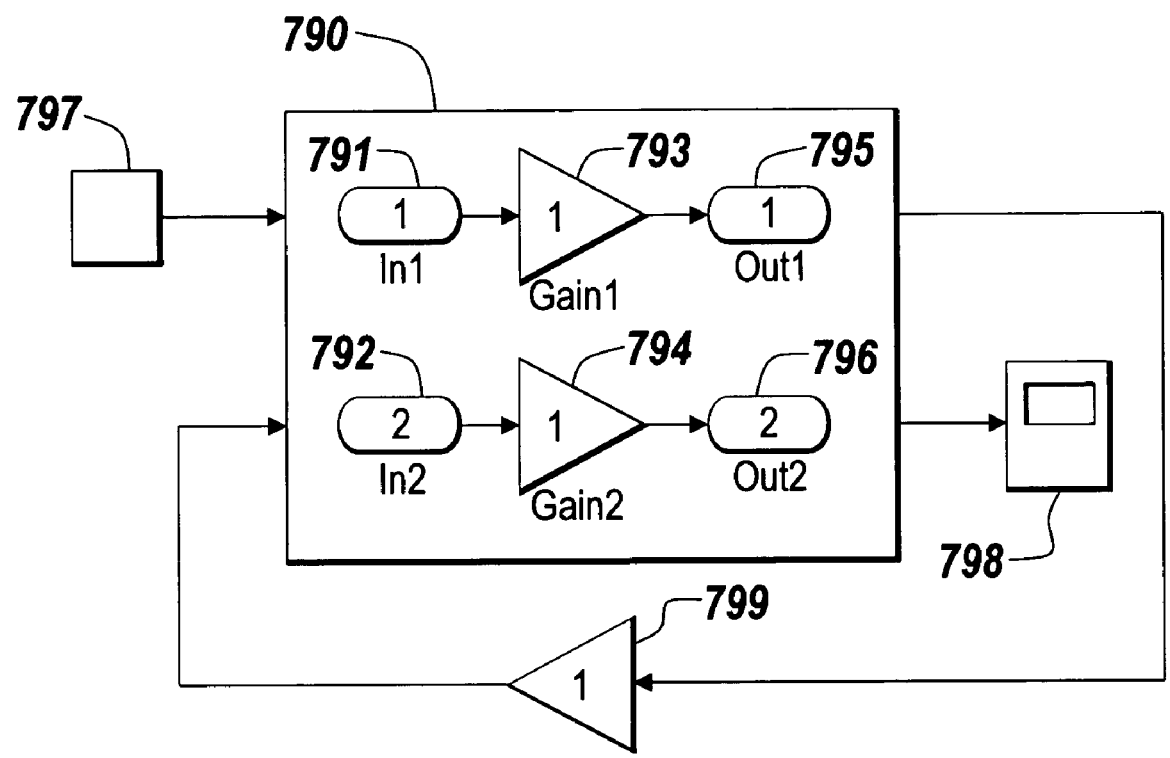
FIG. 21B is a diagrammatic illustration of a sub-system in accordance with aspects of the present invention.

To illustrate, FIG. 21B shows an example diagrammatic illustration of a Sub-system 790. The Sub-system 790 includes a first input 791 and a second input 792, each leading to a first Gain 793 and a second Gain 794, respectively. The first Gain 793 and second Gain 794 have a first output 795 and a second output 796, respectively. An input 797 to the Sub-system 790 leads to an output 798, and a Gain 799 is further provided on the path to input to the Sub-system 790.

Both inputs of the Sub-system 790 have direct feedthrough, making the Sub-system 790 an inseparable unit of computation, i.e., an atomic sub-system, and also resulting in an algebraic loop. This algebraic loop is not present if the constituents of the Sub-system 790 are executed interspersed with the other blocks in the system, in particular the Gain 799.

Multiple calls to evaluate the output of the set of inseparable units of computation (step 778) during the output computation stage of the simulation allows a solution to the system illustrated in FIG. 21B. In general, more than two calls may be required, and analysis of how the Sub-system 790 is connected can provide the required number of calls.

Those of ordinary skill in the art will recognize the opportunity for improved efficiency by selectively executing the constituents of the inseparable unit of the Sub-system 790. For example, the first time the Sub-system 790 is executed, only the first output 795 of the first Gain 793 needs to be computed, while the second call only requires computation of the second output 796 of the second Gain 794. The method to determine the number of required calls to compute the output can be extended to provide information about which input-output relation needs to be evaluated. The evaluation, in turn, provides the required information to implement the more efficient selective execution of constituents.

In general, the unit of inseparable execution may have to be executed more than twice to solve an artificial algebraic loop. Unlike regular algebraic loops that are solved by iteration, the number of iterations of an artificial algebraic loop can be determined a priori, which leads to fixed and determined execution times (a necessity for, e.g., real-time simulation). The number of times the unit of inseparable execution needs to be called can be derived by analysis of the number of times parts of the unit of inseparable execution are being executed interspersed by other computations when not considered inseparable. The number of times parts of the consecutive execution are called equals the number of times the unit has to be called when an inseparable execution is enforced.

Figure 22:
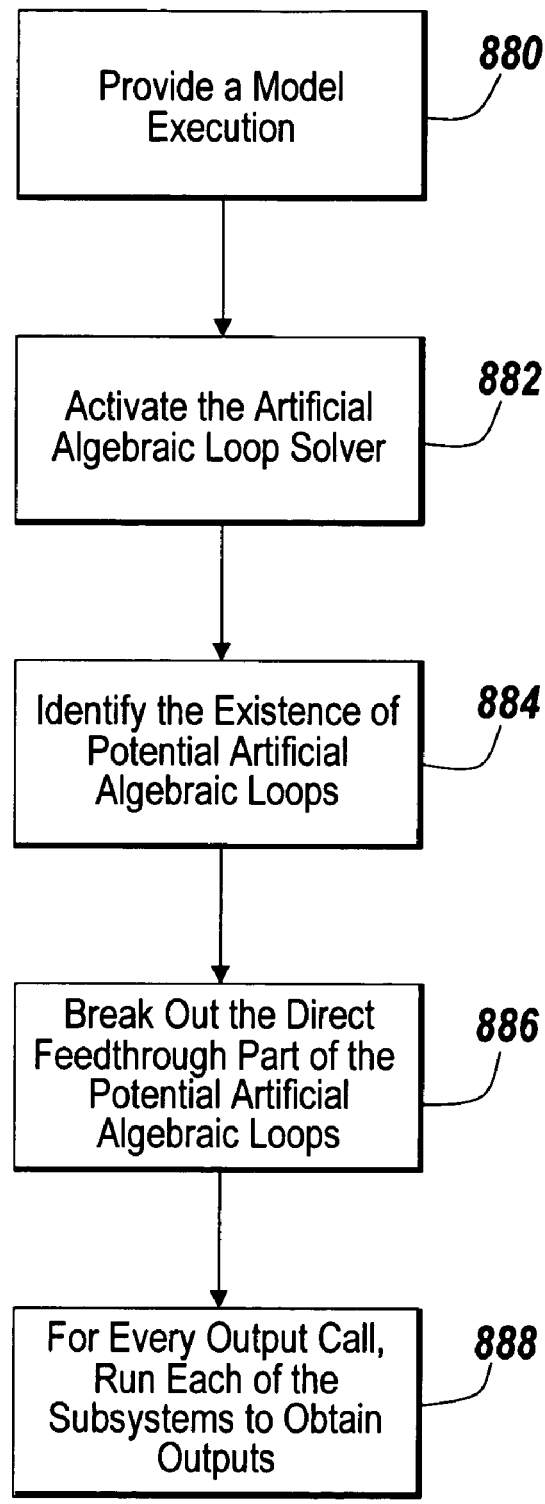
FIG. 22 is a flow chart depicting another method of resolving an artificial algebraic loop, according to one aspect of the present invention.

FIG. 22 illustrates the implementation of another embodiment of the artificial algebraic loop resolver of the present invention. A user first creates or obtains a model execution in a text or equation based, or block diagram based format (step 880). The artificial algebraic loop resolver is then activated, either by a user or automatically (step 882). The artificial algebraic loop resolver identifies the existence of potential artificial algebraic loops by identifying input ports with direct feedthrough that are connected to the output of the same block, either directly, or by a path through other blocks with direct feedthrough (step 884). Once all of the artificial algebraic loops are found they are each broken out into separate sub-systems (step 886). More specifically, the artificial algebraic loop is essentially eliminated by running the output multiple times. To increase implementation efficiency the direct feedthrough paths can be broken up into separate synthesized sub-systems and marking the output ports to which direct feedthrough paths exist from each input port. This is different from the embodiment of FIG. 20 where each input port had a blanket direct feedthrough tag. In the current case, the loop is split apart into separate sub-systems. Each of the sub-systems is then instructed to run the sub-system execution every time that an output is requested (step 888). As previously noted, running the sub-system can be implemented by execution of all or part of the constituents contained within the sub-system. The artificial algebraic loop resolver of this embodiment thus operates to eliminate the update, derivative, and zero-crossing requirement and rely on the individual outputs of each component. This arrangement does require additional function calls to the model execution.

The described algorithms apply directly to handling artificial algebraic loops that emerge because of continuous state as embodied by an Integrator block instead of or in addition to discrete state as embodied by Unit Delay blocks or other discrete state or delay blocks. In the instance of continuous state, the output of the direct feedthrough portion of inseparable computations has to be computed before the continuous state blocks are called to evaluate their derivatives, which is analogous to the update call of unit delay blocks. Therefore, the sub-systems with direct feedthrough parts are synthesized analogously to the discrete event state and now register the need for invocation during the derivative stage of a simulation. In response to the derivative call the synthesized sub-systems evaluate the output of their blocks. Since synthesized blocks are moved to the top of the derivative call list, these output values are first computed before any derivative evaluation of continuous states.

In instances where no discrete states are present in the set of inseparable computations, the synthesized direct feedthrough sub-system does not need to register an invocation during the update stage of a simulation. A special case exists, though, when some of the direct feedthrough computations have a non-continuous sample time. In such an instance, the output will not be computed during minor time steps, thus computing the output of the blocks in the derivative stage fails. The synthesized sub-system, therefore, also registers an invocation during the update stage when it contains blocks with a non-continuous sample time.

Similarly, blocks with zero-crossing detection may be present. These blocks are called to evaluate whether the function they represent crosses zero. Because these evaluations are independent of the update and derivative stages, correct computation of the zero-crossings also requires computing the output of the synthesized sub-system with direct feedthrough blocks. Therefore, when blocks that register zero-crossing functionality are present in the synthesized sub-system or in the set of inseparable blocks of computation, the synthesized sub-system registers an invocation to compute its output during the zero-crossing stage.

Figure 23:
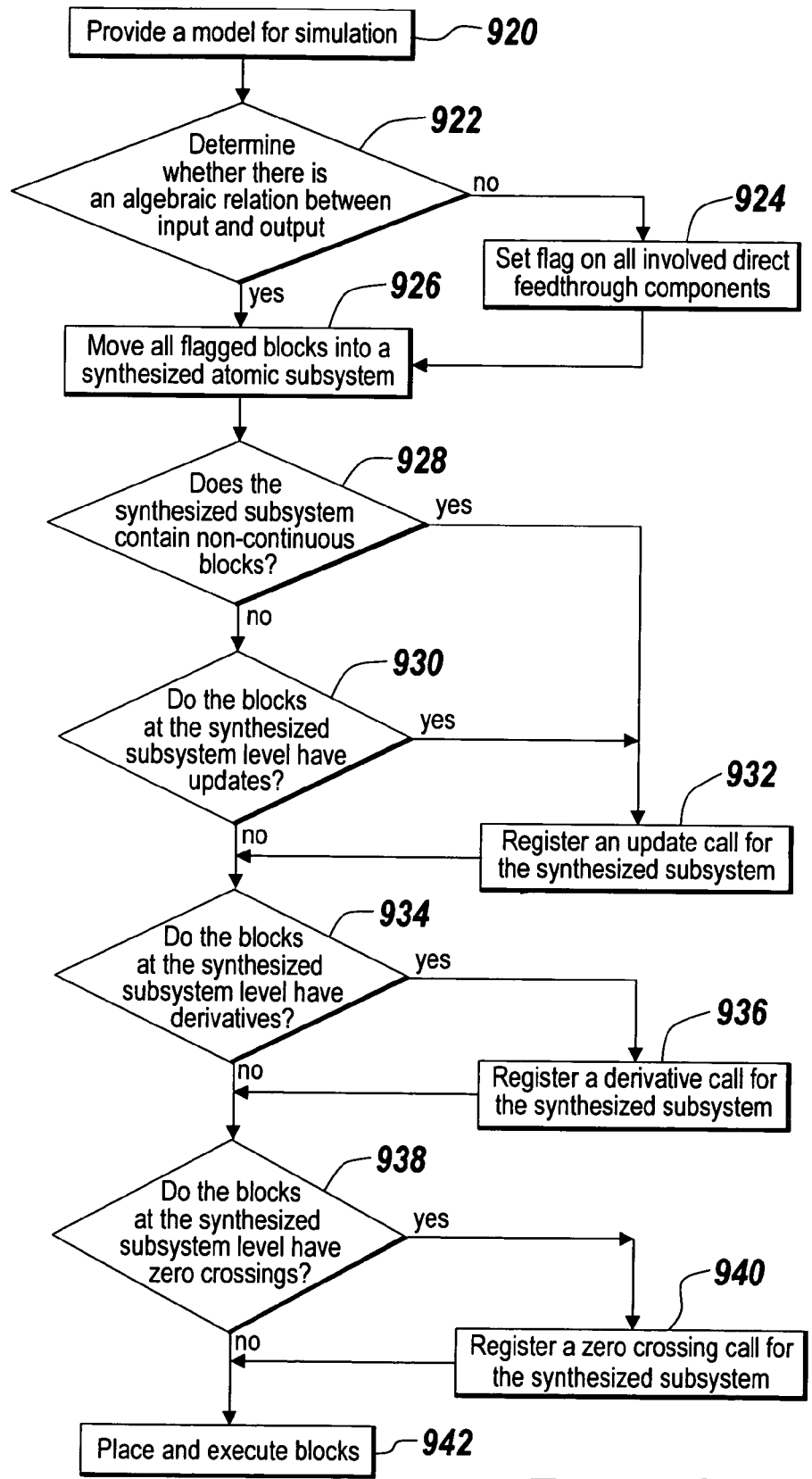
FIG. 23 is a flow chart depicting an example embodiment of resolving an artificial algebraic loop, according to one aspect of the present invention.

FIG. 23 illustrates still another embodiment of the present invention that shows some of the above-described implementation alternatives. A user first creates or obtains a model simulation in a text or equation based, or block diagram based format (step 920). In refining the model simulation, the user can take advantage of the artificial algebraic loop resolver. More specifically, a determination is made as to whether there is an algebraic relationship between input and output, thus determining whether there is a potential artificial algebraic loop (step 922) depending on how the block is used. The artificial algebraic loop resolver identifies the existence of potential artificial algebraic loops by tracing blocks with direct feedthrough in inseparable execution units from the input to the output. If along the processing path, a non-direct feedthrough block is encountered, the path up to the non-direct feedthrough block is considered to be part of a potential artificial algebraic loop and identified as part of the direct feedthrough portion of the inseparable execution unit. Certain model optimization methods may require dependency evaluations to extend the direct feedthrough analysis and include blocks other than those on the direct forward path (i.e., branched dependencies). If a trace of the direct feedthrough blocks reaches an output, though, then the inseparable unit has a direct feedthrough port.

If there is not an algebraic relationship (i.e., there is a potential artificial algebraic loop) a flag is set on all traversed direct feedthrough components and components connected to flagged blocks (step 924). If there is an algebraic relationship, or after the flags are set on the direct feedthrough components, all flagged blocks are moved into a synthesized atomic sub-system (step 926). The synthesized atomic sub-systems are generated based on the input port that connects with the blocks. If they can be traced to multiple input ports (by both forward and backward propagation), they are moved into the sub-system that belongs to the input port with lowest index.

Once all of the synthesized atomic sub-systems are defined, the different variations on execution order are addressed. For each sub-system, a determination is made as to whether the synthesized sub-system contains blocks with a discrete sample time (step 928). If there are no such non-continuous blocks, a determination is made as to whether blocks at the synthesized sub-system level have updates (step 930). If the blocks do have updates, or if the synthesized sub-system contains non-continuous blocks, an update call is registered for the synthesized sub-system (step 932).

If there are no blocks with updates at the synthesized sub-system level, or after the update call is registered, a determination is made as to whether blocks at the synthesized sub-system level have derivatives (step 934). If the blocks have derivatives, a derivative call is registered for the synthesized sub-system (step 936).

If the blocks do not have derivatives, or after the derivative call is registered, a determination is made as to whether blocks at the synthesized sub-system level have zero-crossings (step 938). If there are zero-crossings, a zero-crossing call is registered for the synthesized sub-system (step 940).

Once all of the above determinations are complete, and appropriate registrations are made, all blocks are placed in the synthesized sub-system and invoked during the specified phases of the execution based on update, derivative, and zero-crossing registrations (step 942).

Still another alternative of the present invention involves the introduction of an additional delay function in the loop. This delay can either be a fixed time delay or of a variable nature. In case of a fixed time delay, a relatively small value has to be chosen in order not to substantially affect dynamic behavior. Determining the delay time is not trivial as it relates to the time constant of the artificial algebraic loop as well as time constants of the rest of the system. The use of such a delay, however, introduces a time constant that is, by requirement, much smaller than that of the artificial algebraic loop, and, therefore, increases the computational complexity of solving the loop significantly.

A further alternative includes use of a variable time delay introduced in the artificial algebraic loop. For example, in Simulink®, a Memory block can be applied. The Memory block delays the input by one integration step. This also adds considerably to the computational complexity but circumvents the need to analyze the artificial algebraic loop to decide what is a relatively small time delay value that holds across different operation regimes. Here, the variable delay time adapts to the solver step.

Thus, the present invention relates to an automated solution for addressing artificial algebraic loops in a block diagram or any graphical based language or text or equation based execution, simulation, or modeling system that facilitates execution. The automated solution involves scanning a simulation model to identify each occurrence of a potential artificial algebraic loop. Once each potential artificial algebraic loop is identified, the present invention partitions the inseparable parts of the potential artificial algebraic loop in a regular part and a direct feedthrough part. The output of the latter is computed in the alternate phases of the execution to obtain a correct output of all blocks involved. Determinations and registrations are made as to the proper execution phases for having appropriately computed variables. Then, when tasked to update the model state, compute derivatives, or evaluate zero-crossings, the blocks in the direct feedthrough part first compute their output to obtain correct output values of all blocks in the model.

Numerous modifications and alternative embodiments of the present invention will be apparent to those skilled in the art in view of the foregoing description. Accordingly, this description is to be construed as illustrative only and is for the purpose of teaching those skilled in the art the best mode for carrying out the present invention. Details of the structure may vary substantially without departing from the spirit of the present invention, and exclusive use of all modifications that come within the scope of the appended claims is reserved. It is intended that the present invention be limited only to the extent required by the appended claims and the applicable rules of law.

What is claimed is:

1. In an electronic device, a method of resolving a potential artificial algebraic loop, comprising:
   providing an executable process having a plurality of functions;
   identifying whether the process includes a potential artificial algebraic loop; and
   if the potential artificial algebraic loop exists in the process, implementing an artificial algebraic loop solution that modifies a manner by which the plurality of functions forming the potential artificial algebraic loop execute, while maintaining an outcome of the potential artificial algebraic loop solution.

2. The method of claim 1, wherein the artificial algebraic loop solution comprises executing at least one of a model update function, a derivative function, and a zero-crossing function by rerouting to execute a model output function to obtain output from the plurality of functions and subsequently executing a remaining at least one of a model update function, a derivative function, and a zero-crossing function computing variables contained within the plurality of functions.

3. The method of claim 2, wherein the at least one of a model update function, a derivative function, and a zero-crossing function executes the output function of a plurality of direct feedthrough functions.

4. The method of claim 1, wherein the artificial algebraic loop solution comprises executing a model output function twice, such that a first execution provides an updated input variable and a second execution provides at least one of a desired output and an internal variable.

5. The method of claim 1, wherein the artificial algebraic loop solution comprises executing a model output function a plurality of times, such that a preceding execution provides an updated input variable that allows a subsequent execution to provide at least one of a desired output and an internal variable.

6. The method of claim 1, wherein the artificial algebraic loop solution comprises inserting a delay function prior to the potential artificial algebraic loop and executing the executable process.

7. The method of claim 6, wherein the delay function comprises at least one of a time delay and a memory function.

8. The method of claim 1, wherein the artificial algebraic loop solution comprises switching the order of direct feedthrough functions and non-direct feedthrough functions to prevent the occurrence of the potential artificial algebraic loop.

9. The method of claim 1, wherein identifying whether the process includes the potential artificial algebraic loop comprises determining whether there is at least one path of execution starting at an input wherein a non-direct feedthrough element follows a direct feedthrough element prior to calculation of an output.

10. The method of claim 1, wherein providing the executable process having a plurality of functions includes providing at least one sub-system containing the potential artificial algebraic loop.

11. The method of claim 1, wherein the artificial algebraic loop solution comprises separating a direct feedthrough part from a remainder of the original content to prevent the occurrence of the potential artificial algebraic loop.

12. The method of claim 1, further comprising representing the executable process using a block diagram format.

13. The method of claim 1, further comprising representing the executable process using an equation format.

14. The method of claim 1, further comprising identifying an execution order for the plurality of functions within the potential artificial algebraic loop.

15. The method of claim 1, further comprising executing the plurality of functions based at least in part on whether each of the plurality of functions contains an update call, a derivative call, and a zero-crossing call.

16. The method of claim 1, wherein modifying a manner by which the plurality of functions forming the potential artificial algebraic loop execute comprises re-ordering the execution order of the plurality of functions.

17. A medium holding computer executable steps for carrying out a method of resolving a potential algebraic loop, the method comprising:
provide an executable process having a plurality of functions;
identifying whether the process includes the potential artificial algebraic loop; and
if the potential artificial algebraic loop exists in the process, implementing an artificial algebraic loop solution that modifies a manner by which the plurality of functions forming the potential artificial algebraic loop execute, while maintaining an outcome of the potential artificial algebraic loop solution.

18. The medium of claim 17, wherein the artificial algebraic loop solution comprises executing at least one of a model update function, a derivative function, and a zero-crossing function by rerouting to execute a model output function to obtain output from the plurality of functions and subsequently executing a remaining at least one of a model update function, a derivative function, and a zero-crossing function computing variables contained within the plurality of functions.

19. The medium of claim 18, wherein the at least one of a model update function, a derivative function, and a zero-crossing function executes the output function of a plurality of direct feedthrough functions.

20. The medium of claim 17, wherein the artificial algebraic loop solution comprises executing model output function twice, such that a first execution provides an updated input variable and a second execution provides at least one of a desired output and an internal variable.

21. The medium of claim 17, wherein the artificial algebraic loop solution comprises executing a model output function a plurality of times, such that a preceding execution provides an updated input variable that allows a subsequent execution to provide at least one of a desired output and an internal variable.

22. The medium of claim 17, wherein the artificial algebraic loop solution comprises inserting a delay function prior to the potential artificial algebraic loop and executing the executable process.

23. The medium of claim 22, wherein the delay function comprises at least one of a time delay and a memory function.

24. The medium of claim 17, wherein the artificial algebraic loop solution comprises switching the order of direct feedthrough functions and non-direct feedthrough functions to prevent the occurrence of the potential artificial algebraic loop.

25. The medium of claim 17, wherein identifying whether the process includes the potential artificial algebraic loop comprises determining whether there is at least one path of execution starting at an input wherein a non-direct feedthrough element follows a direct feedthrough element prior to calculation of an output.

26. The medium of claim 17, wherein providing the executable process having a plurality of functions includes providing at least one sub-system containing the potential artificial algebraic loop.

27. The medium of claim 17, wherein the artificial algebraic loop solution comprises separating a direct feedthrough part from a remainder of the original content to prevent the occurrence of the potential artificial algebraic loop.

28. The medium of claim 17, further comprising representing the executable process using a block diagram format.

29. The medium of claim 17, further comprising representing the executable process using an equation format.

30. The medium of claim 17, further comprising identifying an execution order for the plurality of functions within the potential artificial algebraic loop.

31. The medium of claim 17, further comprising executing the plurality of functions based at least in part on whether each of the plurality of functions contains an update call, a derivative call, and a zero-crossing call.

32. The medium of claim 17, wherein modifying a manner by which the plurality of functions forming the potential artificial algebraic loop execute comprises re-ordering the execution order of the plurality of functions.

33. A system for identifying and resolving a potential algebraic loop in a process, comprising:
an identification mechanism for identifying whether the process includes the potential artificial algebraic loop; and
an artificial algebraic loop solution for resolving the potential algebraic loop;
wherein the artificial algebraic loop solution modifies a manner by which the plurality of functions forming the potential artificial algebraic loop execute, while maintaining an outcome of the potential artificial algebraic loop solution.

34. The system of claim 33, wherein the artificial algebraic loop solution comprises executing at least one of a model update function, a derivative function, and a zero-crossing function by rerouting to execute a model output function to obtain output from the plurality of functions and subsequently executing a remaining at least one of a model update function, a derivative function, and a zero-crossing function computing variables contained within the plurality of functions.

35. The system of claim 34, wherein the at least one of a model update function, a derivative function, and a zero-crossing function executes the output function of a plurality of direct feedthrough functions.

36. The system of claim 33, wherein the artificial algebraic loop solution comprises execution of a model output function twice, such that a first execution provides an updated input variable and a second execution provides at least one of a desired output and an internal variable.

37. The system of claim 33, wherein the artificial algebraic loop solution comprises execution of a model output function a plurality of times, such that a preceding execution provides an updated input variable that allows a subsequent execution to provide at least one of a desired output and an internal variable.

38. The system of claim 33, wherein the artificial algebraic loop solution comprises insertion of a delay function prior to the potential artificial algebraic loop and execution of the executable process.

39. The system of claim 38, wherein the delay function comprises at least one of a time delay and a memory function.

40. The system of claim 33, wherein the artificial algebraic loop solution comprises a switching of the order of direct feedthrough functions and non-direct feedthrough functions to prevent the occurrence of the potential artificial algebraic loop.

41. The system of claim 33, wherein the identification mechanism determines whether there is at least one path of execution starting at an input wherein a non-direct feedthrough element follows a direct feedthrough element prior to calculation of an output.

42. The system of claim 33, wherein the process includes at least one sub-system containing the at least one artificial algebraic loop.

43. The system of claim 33, wherein the artificial algebraic loop solution comprises separation of a direct feedthrough part from a remainder of the original content to prevent the occurrence of the potential artificial algebraic loop.

44. The system of claim 33, further comprising the executable process represented in a block diagram format.

45. The system of claim 33, further comprising the executable process represented in an equation format.

46. The system of claim 33, further comprising the system having an execution order for the plurality of functions within the potential artificial algebraic loop.

47. The system of claim 33, further comprising the system having an execution order for executing the plurality of functions based at least in part on whether each of the plurality of functions contains an update call, a derivative call, and a zero-crossing call.

48. The system of claim 33, wherein modifying a manner by which the plurality of functions forming the potential artificial algebraic loop execute comprises re-ordering the execution order of the plurality of functions.

* * * * *